(12) United States Patent
Akiyama

(10) Patent No.: US 8,111,457 B2
(45) Date of Patent: Feb. 7, 2012

(54) METHOD OF MANUFACTURING SCREEN AND SCREEN

(75) Inventor: Koichi Akiyama, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 225 days.

(21) Appl. No.: 12/533,754

(22) Filed: Jul. 31, 2009

(65) Prior Publication Data

US 2010/0039703 A1   Feb. 18, 2010

(30) Foreign Application Priority Data

Aug. 12, 2008  (JP) ................................. 2008-207686
Jul. 13, 2009  (JP) ................................. 2009-164528

(51) Int. Cl.
*G03B 21/60* (2006.01)

(52) U.S. Cl. ........ 359/443; 359/449; 359/455; 359/459; 359/614

(58) Field of Classification Search .................. 359/443, 359/449, 455, 459, 614
See application file for complete search history.

(56) References Cited

U.S. PATENT DOCUMENTS

| | | | | |
|---|---|---|---|---|
| 3,964,822 A * | 6/1976 | Yamashita | .................... | 359/443 |
| 6,894,835 B2 * | 5/2005 | Ohsako et al. | ................ | 359/449 |
| 7,911,694 B1 * | 3/2011 | Katsuma et al. | ............... | 359/459 |
| 2009/0021828 A1 * | 1/2009 | Shinbo et al. | ................. | 359/443 |

FOREIGN PATENT DOCUMENTS

| | | |
|---|---|---|
| GB | 2 413 860 A | 11/2005 |
| JP | A-04-191727 | 7/1992 |
| JP | A-05-011348 | 1/1993 |
| JP | A-06-075301 | 3/1994 |
| JP | A-06-258717 | 9/1994 |
| JP | A-11-142975 | 5/1999 |
| JP | A-2004-038002 | 2/2004 |
| JP | A-2005-215396 | 8/2005 |
| JP | A-2006-023693 | 1/2006 |
| JP | A-2006-065164 | 3/2006 |
| JP | A-2006-215162 | 8/2006 |
| JP | A-2006-259643 | 9/2006 |

* cited by examiner

*Primary Examiner* — Clayton E Laballe
*Assistant Examiner* — Kevin Butler
(74) *Attorney, Agent, or Firm* — Oliff & Berridge, PLC

(57) ABSTRACT

A method of manufacturing a screen having a screen substrate provided with a plurality of three-dimensional shape units disposed two-dimensionally on a front side of the screen substrate, includes: forming a first film by applying a first film forming material to be an antireflection film to at least part of surfaces of the three-dimensional shape units among the screen substrate; and forming a second film by applying a second film forming material to be a reflecting film with a predetermined incident angle to the screen substrate, the reflecting film on at least part of the antireflection film.

17 Claims, 17 Drawing Sheets

METHOD OF MANUFACTURING SCREEN AND SCREEN

BACKGROUND

1. Technical Field

The present invention relates to a method of manufacturing a screen for reflecting projection light from a projection apparatus such as a projector disposed in front thereof to provide a projection image, and the screen.

2. Related Art

As a reflective screen for reflecting a projection image, there is known a screen, which makes it possible to obliquely project the projection image from below and to observe it in the front side, and which has a number of convex unit shape sections arranged two-dimensionally on a screen substrate, each unit shape section being provided with a reflecting surface for reflecting projection light, the reflecting surface being formed partially on a surface of the unit shape section in accordance with a position of projection from a projector or the like, thereby blocking outside light from above (see JP-A-2006-215162).

However, regarding an influence of the outside light from above, since the some of the incident light is reflected but not transmitted nor absorbed even in the case of using, for example, a light transmissive or light absorbing material in a portion of the screen other than the reflecting surface, the outside light cannot necessarily be prevented sufficiently on the surface of the screen. In this case, there is a possibility that some of the outside light entering the area other than the reflecting surface is reflected to exert an influence on the projection image. Therefore, in order for preventing the outside light from above more effectively, it is desirable that a treatment for antireflection is executed on the area other than the reflecting surface on the surface of the screen. However, in the case of executing the antireflection treatment by forming an antireflection film, for example, it is not necessarily easy to form the antireflection film because more precise thickness control than in forming the reflection surface is required, and the shape of the area in which the antireflection film needs to be formed is complicated. It is also not necessarily easy to form the reflection surface with good condition about the durability, for example, on the surface of the screen. Especially forming the reflection film that dose not exfoliate easily on the variant screen substrate is not easy.

SUMMARY

An advantage of some aspects of the invention is to provide a screen capable of performing stable projection with preferable image quality, and a method of manufacturing the screen.

A method of manufacturing a screen according to an aspect of the invention is a method of manufacturing a screen having a screen substrate provided with a plurality of three-dimensional shape units disposed two-dimensionally on a front side of the screen substrate, comprising the step of, forming a first film by applying a first film forming material to be a first film to at least part of surfaces of the three-dimensional shape units among the screen substrate, and forming a second film by applying a second film forming material to be a reflecting film with a predetermined incident angle to the screen substrate, the reflecting film on at least part of the first film.

In the method of manufacturing a screen described above, the first film such that might be an antireflection film, a foundation film or the like is formed to at least part of surfaces of the three-dimensional shape units in the step of forming the first film, and the reflecting film is formed on at least part of the antireflection film in the step of forming the second film. It is possible to improve in quality of the screen or increase attachment strength of the reflection film by forming such first film in advance.

Further, according to a specific aspect of the invention, an antireflection film as the first film forms on entire are of surfaces of the three-dimensional shape units in the first film forming step includes the step. In this case, it becomes possible to form the antireflection film capable of appropriately preventing the reflection of the outside light, and further, to form the reflecting film for appropriately reflecting the projection light in each of the three-dimensional shape units. Therefore, a screen capable of performing projection with further improved contrast of the projection light and the image quality thus stabilized can be provided.

Further, according to a specific aspect of the invention, the antireflection film is a dielectric film. In this case, by forming the dielectric film controlled to have an appropriate film thickness in the first film forming step, the reflection of the unnecessary components such as the outside light can reliably be reduced using the retardation in phase caused by the dielectric film.

Further, according to an aspect of the invention, a foundation film as the first film forms to increase attachment strength of the reflection film in the first film forming step. In this case, it becomes possible to increase attachment strength of the reflection film to the screen, thereby forming the reflection film at desire location and increasing durability thereof Therefore, a screen capable of performing stable projection with preferable image quality can be provided.

Further, according to an aspect of the invention, in the second film forming step, the second film forming material is ejected from a material source disposed at a position corresponding to a position of a projection light source point. Thus, it becomes possible to make the second film forming material enter the screen substrate with a predetermined incident angle, and to form the reflecting film on a desired area of the three-dimensional shape units provided with the antireflection film.

Further, according to another aspect of the invention, in the second film forming step the screen substrate is mounted in a chamber, which includes an internal surface having a cylindrical shape in an internal space thereof, along the internal surface, and the reflecting film is formed by ejecting the second film forming material from a material source disposed in a vicinity of a central axis of the cylindrical shape in the chamber. In this case, the shape of the reflecting film becomes to avoid reflection of the outside light while hardly degrading the reflection efficiency of the projection light. Further, according to the method of manufacturing a screen described above, the screen can be housed in the small chamber.

Further, according to another aspect of the invention, the reflecting film is a metal film, and the method further includes the step of forming a third film by applying a third film forming material to be a covering film adapted to cover the metal film. In this case, it becomes possible by the covering film to protect the metal film so as not to exfoliate or oxidize, or to enhance the reflecting operation of the metal film.

Further, according to another aspect of the invention, in the third film forming step, the formation of the third film is executed on the same area as the formation of the second film in the second film forming step. In this case, it is possible to form the covering film in the necessary area without waste. Further, since the antireflection film and the covering film do not have direct contact with each other, for example, no problem is caused even in the case in which the adhesiveness between the both films is poor.

Further, according to another aspect of the invention, in the first film forming step and the second film forming step, a method of forming the films with the first and second film forming materials is one of a vacuum evaporation method, an ion assisted method, and a sputtering method. In this case, it becomes possible to provide high directionality to the film forming material ejected from the material source, and thus, the reflecting film with a preferable reflecting property can be formed with a desired condition.

A screen according to an aspect of the invention is a screen having a screen substrate provided with a plurality of three-dimensional shape units disposed two-dimensionally on a front side of the screen substrate, including an first film formed at least part of surfaces of the three-dimensional shape units among the screen substrate, and a reflecting film formed on an area corresponding to incidence of projection light among an area of the first film.

In the screen described above, the first film is formed to at least part of surfaces of the three-dimensional shape units in advance. Thus, it is possible to improve in quality of the screen or increase attachment strength of the reflection film.

Further, according to a specific aspect of the invention, the reflecting film is a metal film, and the screen further includes a covering film adapted to cover the metal film. In this case, it becomes possible by the covering film to protect the metal film so as not to exfoliate or oxidize, or to enhance the reflecting operation of the metal film.

Further, according to another aspect of the invention, the covering film is one of a metal protecting film formed from a material protecting the metal film and a reflection enhancement film formed from a material enhancing a reflecting operation by the metal film. In this case, it becomes possible to protect the metal film so as not to exfoliate or oxidize if the metal protecting film is used as the covering film, or to enhance the reflecting operation of the metal film if the reflection enhancement film is used as the covering film.

Further, according to another aspect of the invention, the covering film is formed in an area identical to an area of the metal film. In this case, it is possible to form the covering film in the necessary area without waste. Further, since the antireflection film and the covering film do not have direct contact with each other, for example, no problem is caused even in the case in which the adhesiveness between the both films is poor.

Further, according to another aspect of the invention, the reflecting film is a dielectric multilayer film, and the most superficial layer of the dielectric multilayer film is exposed as a part of a surface of the screen. In this case, the reflecting film can be made to have sufficient strength and a sufficient reflecting property without using, for example, the covering film.

Further, according to another aspect of the invention, the first film includes an antireflection film formed on entire are of surfaces of the three-dimensional shape units. When the antireflection film includes a dielectric layer, the reflection of the unnecessary components such as the outside light can reliably be reduced using the retardation in phase caused by the dielectric layer controlled to have an appropriate film thickness.

Further, according to another aspect of the invention, the antireflection film is a dielectric multilayer film. It becomes possible to improve the characteristic of antireflection using the difference in refractive index caused by the multilayer structure in the dielectric multilayer film.

Further, according to another aspect of the invention, the antireflection film is a composite film including a dielectric layer and a metal layer. In this case, by forming the composite film having the dielectric layer on, for example, the light absorbing metal layer, the outside light component which is not sufficiently absorbed by the metal layer can be addressed by the dielectric layer, thereby obtaining the antireflection film with improved antireflection effect.

Further, according to another aspect of the invention, the first film includes a foundation film to increase attachment strength of the reflection film. The foundation film is a metal film formed by a physical deposition method or a physical vapor deposition method, or a resin film formed by an applying method. When the foundation film is a metal film, it is possible to easily improve durability of the foundation film and attachment strength of the metal film. In contrast, when the foundation film is a resin film, it becomes that easier to manufacture the foundation film.

Further, according to another aspect of the invention, the screen substrate has a light absorbing function. In this case, the unnecessary component such as the outside light entering the screen substrate can be absorbed. When the screen substrate includes black vinyl chloride, it is possible to ensure high-contrast without the antireflection film and improve durability of the screen substrate at a low cost.

Further, according to another aspect of the invention, the screen substrate includes black vinyl chloride as the light absorbing member. In this case, since the screen substrate has light absorbing property in itself, it is possible to not only omit the antireflection film but also improve durability of the screen substrate at a low cost.

BRIEF DESCRIPTION OF THE DRAWINGS

The invention will now be described with reference to the accompanying drawings, wherein like numbers reference like elements.

DESCRIPTION OF EXEMPLARY EMBODIMENTS

First Embodiment

Figure 1:
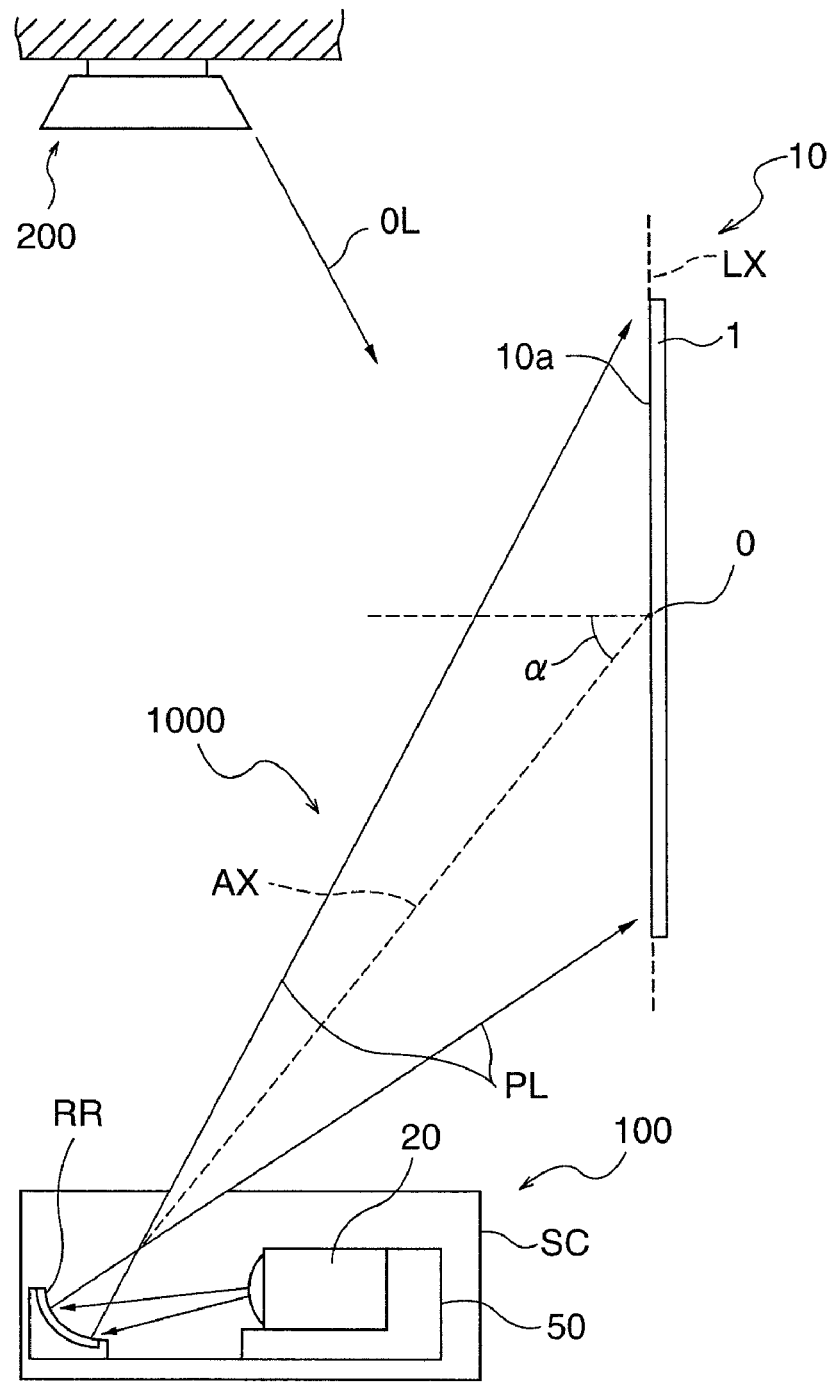
FIG. 1 is a diagram showing a projection system using a screen according to a first embodiment.
Figure 2:
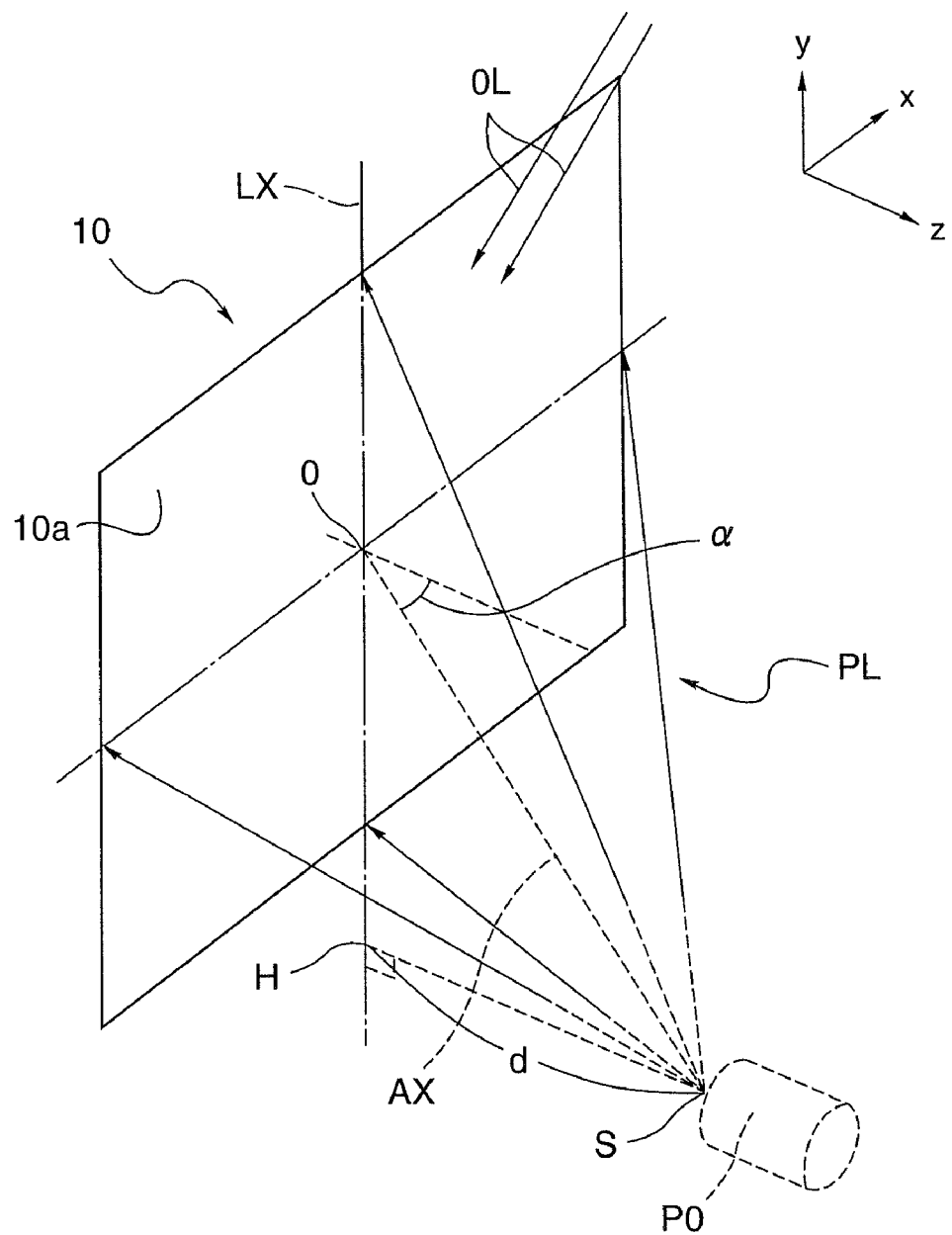
FIG. 2 is a schematic diagram for explaining a use condition of the entire screen.

A screen according to a first embodiment of the invention will hereinafter be explained with reference to the accompanying drawings. FIG. 1 is a diagram showing an example of a projection system using a screen according to the present embodiment. Further, FIG. 2 is a schematic diagram for explaining a use condition of the entire screen of the present embodiment.

As shown in FIG. 1, the projection system 1000 is provided with a reflective screen 10 and a projector 100 as an image projection apparatus. The screen 10 is provided with a screen substrate 1 formed from light transmissive resin, and has a landscape-oriented rectangular shape installed with the long side thereof in a horizontal direction, namely the x direction, and the short side thereof in a vertical direction, namely the y direction, as shown in FIG. 2. It should be noted that on the surface formed by processing the front face 10a of the screen 10, namely the front side of the screen substrate 1, there is formed a microscopic structure, not shown, described later in detail. Further, as shown in FIG. 1, the projector 100 disposed in front of and below the screen 10 is provided with a projector main body 50, a projection lens main body 20, and a reflecting mirror RR. Each of mechanisms constituting the projector 100 is housed in the housing SC.

Hereinafter, image projection on the screen 10 by the projector 100 will be explained. Firstly, in accordance with the control in the projector main body 50, image light is formed, and is emitted from the projection lens main body 20. Further, the image light is reflected by the reflecting mirror RR, and is emitted toward the screen 10 as projection light PL from the projector 100. On this occasion, the projector 100 projects the projection light PL from below the screen 10 at an incident angle a to the center position O of the screen 10. The projection light PL projected to the screen 10 is reflected frontward by the reflecting surfaces on the microscopic relief structure, not shown, formed on the front face 10a of the screen 10, and becomes observable as an image having a rectangular shape bilaterally symmetric to a vertical axis LX passing through the center position O. It should be noted here that in the installation environment of the screen 10 and the projector 100, illumination by the outside light OL from above is provided by an illumination device 200 suspended from the ceiling in a room.

Hereinafter, the positional relationship between the projection light PL projected from the projector 100 shown in FIG. 1 and the screen 10 will be explained with reference to FIG. 2. The projection lens PO shown in FIG. 2 corresponds to the projection lens main body 20 and the reflecting mirror RR shown in FIG. 1, and the projection light PL from a projection light source point S shown in FIG. 2 is arranged to enter the screen 10 at the same projection angle as in the case of the projection light PL shown in FIG. 1. In more specific explanations, the projection light source point S is disposed at a lower position relatively close to the screen 10 so that the light beam axis AX of the projection light PL entering the center position O of the screen 10 has the incident angle α. Further, here, the distance (i.e., the distance from the projection light source point S to an intersection H at which a line drawn from the projection light source point S perpendicularly to a plane including the front face 10a of the screen 10 intersects with the plane) from the projection light source point S to the screen 10 corresponds to a projection distance d.

In the case of a so-called front projection type such as the screen 10 shown in the drawing, it is desirable that the optical design of the microscopic relief structure on the front face 10a is made in accordance with the incident angle of the projection light PL at each position determined by the incident angle α and the projection distance d based on the center position O. In contrast, it is desirable to design the screen 10 so as not to reflect the outside light OL from above on the front face 10a toward the side where the observer is located.

For example, in the screen 10, even in the case in which the screen substrate 1 is formed from the light transmissive material as described above, the outside light OL is partially reflected on the surface of the light transmissive material due to the difference in refractive index between the air and the light transmissive material. Therefore, it is desirable that a treatment for antireflection such as provision of an AR coat to the place where the outside light OL enters is executed on the front face 10a. In the present embodiment, in the light of the circumstances described above, in addition to providing the surface of the front face 10a with the microscopic relief structure with a predetermined shape in a predetermined pattern, the treatment for antireflection is executed on the microscopic relief structure.

Figure 3:
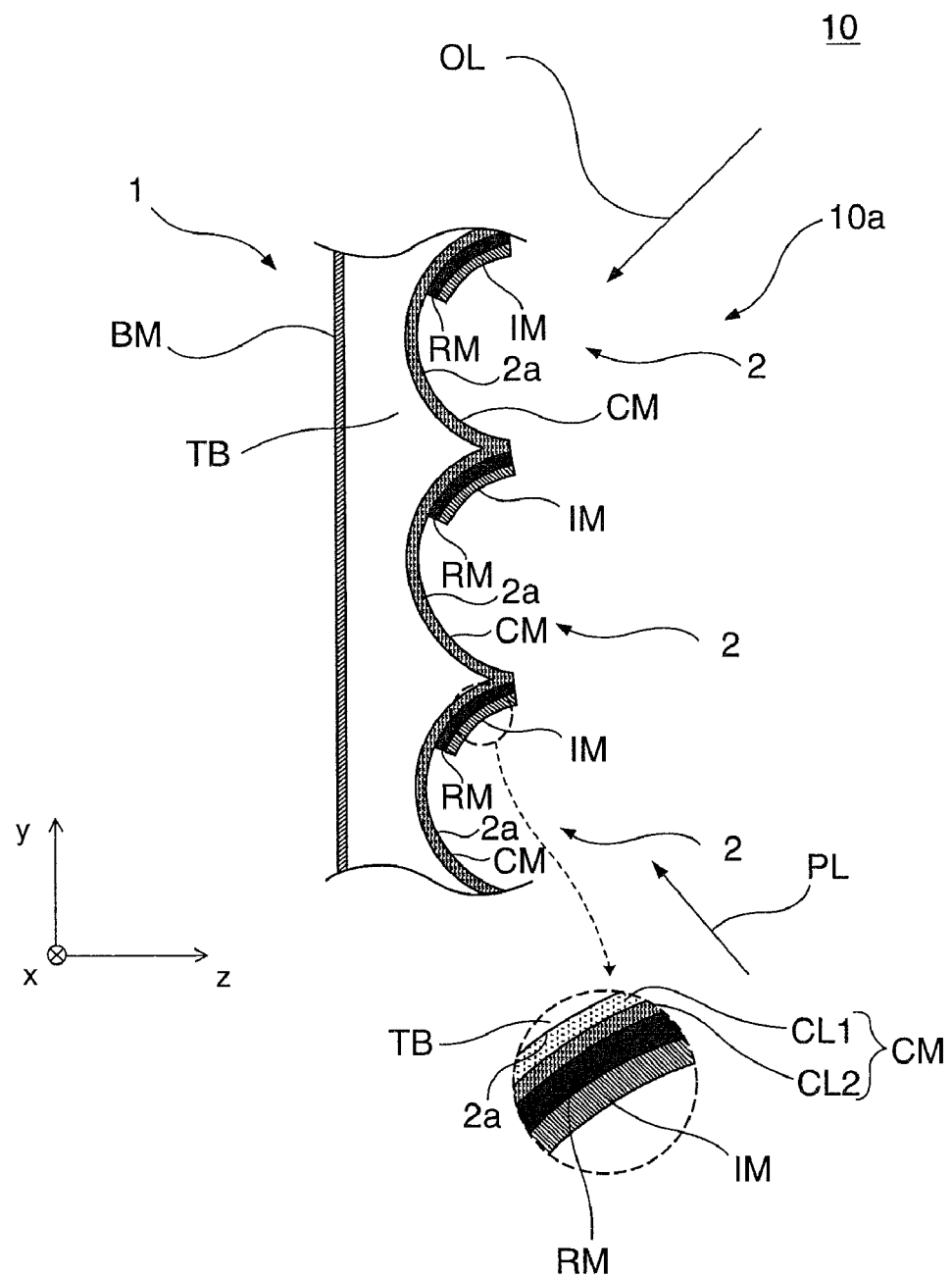
FIG. 3 is an enlarged side cross-sectional view of a part of the screen.

Hereinafter, an overall structure of the screen 10 will be explained around the surface structure provided to the front face 10a of the screen 10 with reference to FIG. 3. FIG. 3 is an enlarged side cross-sectional view of a part of the screen 10. The screen substrate 1 forming a base has a transparent substrate TB as a main body section formed from the light transmissive material such as transparent PET and a light absorbing surface BM formed by applying black ink on a reverse side of the transparent substrate TB. On the front side of the transparent substrate TB, there are formed a number of three-dimensional shape units 2a forming the relief surface. The number of three-dimensional shape units 2a respectively have spherical concave surfaces, and are formed on the front side of the screen substrate 1 two-dimensionally with no space therebetween. The entire surfaces of the number of three-dimensional shape units 2a are provided with an antireflection film CM as a first film. Further, on an upper part, namely +y direction side, of each of the three-dimensional shape units 2a among the area occupied by the antireflection film CM thus formed on each of the three-dimensional shape units 2a, there is formed a reflecting film RM functioning as a reflecting surface for reflecting frontward the projection light PL from below. Further, on the reflecting film RM, there is formed a covering film IM for covering the reflecting film RM. As described above, the microscopic relief structure provided to the front face 10a of the screen 10 is formed as a structure in which a triple-layer composed of the antireflection film CM, the reflecting film RM, and the covering film IM is provided to each of a number of three-dimensional shape units 2a provided by the screen substrate 1 on the front side thereof. It should be noted here that the covering film IM is formed in the same area as the reflecting film RM, and covers the reflecting film RM in just proportion. Therefore, the covering film IM is kept in the state of not having contact with the antireflection film CM.

The antireflection film CM is a laminated film or a dielectric multilayer film composed of a first layer CL1 and a second layer CL2 as shown in the partial enlarged view of FIG. 3. The first layer CL1 as a lower layer and the second layer CL2 as an upper layer are made of materials different in refractive index from each other. The antireflection film CM makes the light interfere with each other using the difference in refractive index, thereby causing the function of antireflection. It should be noted that it is possible to cause a desired difference in refractive index by using, for example, titanium dioxide ($TiO_2$) and silicon dioxide ($SiO_2$) as the materials of the respective layers CL1, CL2.

As described later in detail, the reflecting film RM is a metal film formed by, for example, evaporating aluminum. The covering film IM is formed by, for example, evaporating silicon dioxide ($SiO_2$), and functions as a metal protective film for preventing the reflecting film RM from peeling or oxidizing. The covering film IM can also be arranged to function as a reflection enhancement film for enhancing the reflective function of the reflecting film RM by being formed to have, for example, a multilayer film structure with $TiO_2$ and $SiO_2$ or a multilayer film structure with $Ta_2O_5$ (tantalum pentoxide) and $SiO_2$ instead of the single layer film with $SiO_2$ described above.

As described above, a number of surface sections 2 are provided to the front face 10a with a number of three-dimensional shape units 2a, the antireflection film CM formed on each of the three-dimensional shape units 2a, and the reflecting film RM formed on a part of the antireflection film CM. It is arranged that the antireflection film CM of each of the number of surface sections 2 prevents the reflection of the outside light OL entering an area other than the reflecting film RM in an appropriate manner. Further, the reflecting film RM is arranged to be formed at a position where the reflecting film RM appropriately reflects the projection light PL and reflects as little outside light OL as possible, as described later. It should be noted that since the number of three-dimensional shape units 2a are formed with no space therebetween as described above, at least an effective area of the front face 10a in which the image projection is performed is in the condition of being completely filled with a number of surface sections 2 with no flat area left. In this case, since no flat area is left, the phenomenon called hotspot in which the light is reflected specularly and enters observer's eyes can be avoided.

Hereinafter, the position where the reflecting film RM is formed on each of the three-dimensional shape units 2a will be explained. As described above, the projection light PL from the projector or the like is emitted from the projection light source point S (see FIG. 2) located below the screen 10, and enters the screen 10 while spreading conically. In accordance therewith, the reflecting film RM is formed only locally in an upper part, namely a part on the +y direction side of the concave shape formed with each of the three-dimensional shape units 2a. In other words, the reflecting film RM is formed so as to be opposed to the projection light PL from below, and is arranged to reflect the projection light PL toward the front side where the observer is located in an appropriately diffused state. In contrast, the reflecting film RM is arranged not to reflect the outside light OL from above toward the front side where the observer is located. As described above, it is arranged that the reflecting film RM can appropriately emit the projection light PL toward the front side on the front face 10a, and at the same time efficiently prevents the reflection of the outside light OL.

Hereinafter, a method of manufacturing the screen 10 will be explained. Firstly, manufacturing of the screen substrate 1 of the screen 10 will briefly be explained. The screen substrate 1 is formed using a sheet like member made, for example, of transparent polyethylene terephthalate (PET) having a light transmissive property, and light absorbing black ink as principal materials. Specifically, after coating a surface of the sheet like member with UV cured resin, for example, or after heating the surface of the sheet like member to be softened, press embossing is executed thereon with a glass die having the relief shape corresponding to a number of three-dimensional shape units 2a. Thus, a transparent substrate TB as a main body section of the screen substrate 1 is formed. Further, a light absorbing surface BM is formed by applying the black ink having a light absorbing function on the reverse side of the transparent substrate TB in a thin layer, thus the screen substrate 1 is manufactured.

Figure 4A:
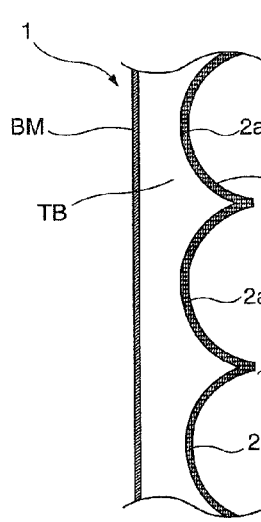
FIGS. 4A through 4C are side cross-sectional views for explaining a manufacturing process of a surface section of the screen.
Figure 4B:
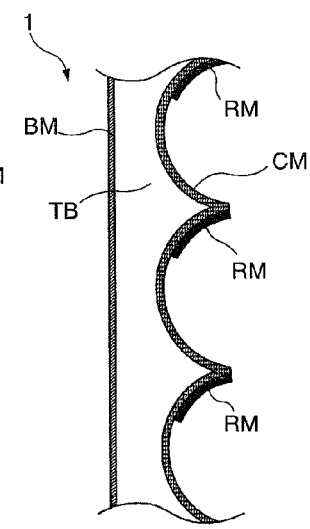
Figure 4C:
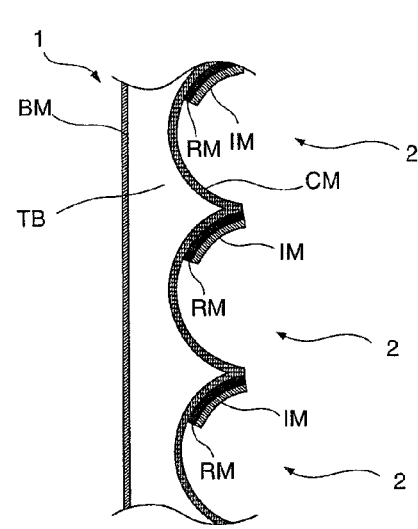

Then, a process of manufacturing the surface sections 2 respectively formed on the three-dimensional shape units 2a will be explained. FIGS. 4A through 4C are side cross-sectional views for explaining the process of manufacturing a number of surface sections 2 of the screen 10. Firstly, as shown in FIG. 4A, the antireflection film CM is formed on the entire surface of a number of three-dimensional shape units 2a with a roughly constant film thickness (a first film forming process). Then, as shown in FIG. 4B, the reflecting film RM is formed (a second film forming process) in a partial area on each of the three-dimensional shape units 2a, and subsequently, as shown in FIG. 4C, the covering film IM is formed (a third film forming process) on the reflecting film RM. A number of surface sections 2 are formed through the first, second, and third film forming processes, thereby manufacturing the screen 10.

Figure 5A:
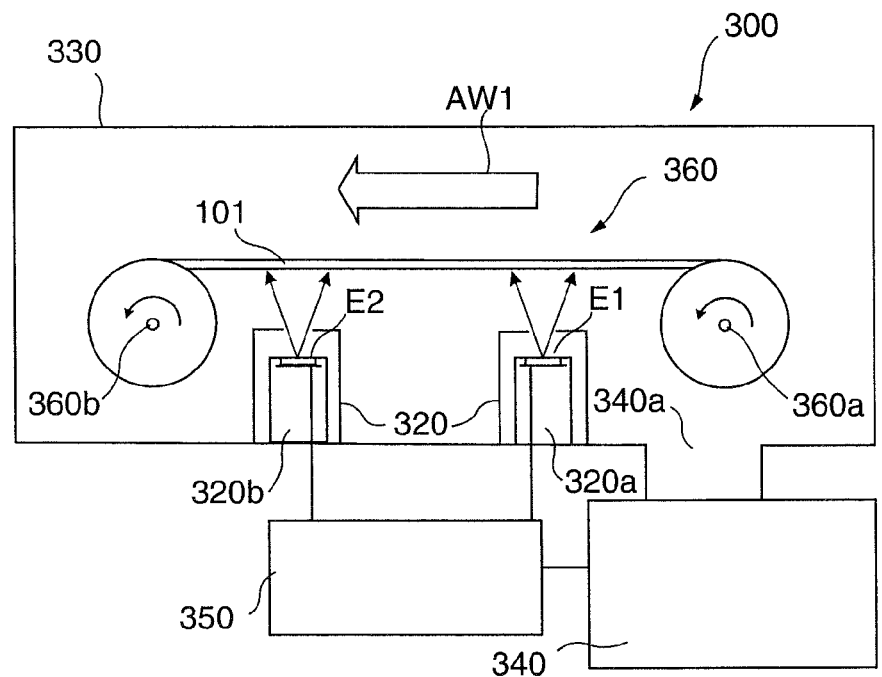
FIGS. 5A and 5B are side cross-sectional diagrams each explaining an example of a manufacturing apparatus for forming an antireflection film.

Hereinafter, the first film forming process among the first, second, and third film forming processes described above will firstly be explained. FIG. 5A is a side cross-sectional diagram for explaining an example of a first manufacturing apparatus for performing formation of the antireflection film CM in the first film forming process. The first manufacturing apparatus 300 shown in FIG. 5A is a vacuum evaporation apparatus for forming a film by vacuum evaporation while evaporating the film forming material using, for example, resistive heating. The first manufacturing apparatus 300 is provided with an evaporation source device 320 containing a source material, a chamber 330 as a vacuum container, a vacuum pump 340, which is an exhaust system for creating a vacuum condition inside the chamber 330, and is formed of a rotary pump or the like, and a control device 350 for performing overall control of the sections to control the entire apparatus. Further, the first manufacturing apparatus 300 is provided with a moving device 360 for feeding a belt like screen substrate 101. The moving device 360 is provided with a delivery mechanism 360a for delivering the belt like screen substrate 101, and a winding mechanism 360b for winding the screen substrate 101. It should be noted that a motor and so on to be attached to each of the mechanisms 360a, 360b are omitted from the drawing. The evaporation source device 320 is provided with a first ejection device 320a for ejecting titanium dioxide ($TiO_2$) as a first component E1 for forming the first layer CL1 among the first film forming material for forming the antireflection film CM shown in FIG. 3, and a second ejection device 320b for ejecting silicon dioxide ($SiO_2$) as a second component E2 for forming the second layer CL2 among the first film forming material. The first and the second ejection devices 320a, 320b respectively mount the first and second components E1, E2 on the boats, and heat to evaporate the respective components E1, E2 by the resistive heating using electrical power supplied from the control device 150, thereby performing the film formation. It should be noted that the belt like screen substrate 101 corresponds to a plurality of (e.g., 100 sheets of) screen substrates 1. In other words, what is obtained by cutting the screen substrate 101 into pieces with a predetermined size corresponds to a sheet of screen substrate 1.

As shown in FIG. 5A, in the moving device 360, the belt like screen substrate 101 is in the state of having the both ends respectively wound around the mechanisms 360a, 360b like a cassette tape. It is arranged that in accordance with the mechanisms 360a, 360b rotating in one direction in sync with each other, the moving device 360 moves the screen substrate 101 in a direction of the arrow AW1 at a constant speed. Further, the ejection devices 320a, 320b are disposed below the screen substrate 101 fed by the moving device 360 and opposed to the front side of the screen substrate 101, and arranged to apply the respective components E1, E2 of the first film forming material approximately perpendicularly to the screen substrate 101. Further, each of the ejection devices 320a, 320b is disposed so as to form a line extended from the front side of the sheet of FIG. 5A to the back side thereof so that the film can be formed uniformly throughout the entire surface of the screen substrate 101.

Hereinafter, an operation of the first manufacturing apparatus 300 will be explained. Firstly, the air is exhausted from an exhaust port 340a of the vacuum pump 340 to make a vacuum state with pressure no higher than a predetermined value (e.g., no higher than $10^{-3}$ Pa) inside the chamber 330. Then, the mechanisms 360a, 360b are driven to feed the screen substrate 101, thereby exposing a process object part of the screen substrate 101 for forming the antireflection film CM. When the process object part of the screen substrate 101 is fed from the delivery mechanism 360a to be exposed in the chamber 330, the first component E1 ejected perpendicularly from the first ejection device 320a is first applied to the process object part of the screen substrate 101. Thus, the first layer CL1 is provided to the process object part of the screen substrate 101. Subsequently, the second component E2 ejected perpendicularly from the second ejection device 320b is applied to the process object part of the screen substrate 101. Thus, the second layer CL2 is provided to the process object part of the screen substrate 101. The process object part of the screen substrate 101 provided with the antireflection film CM composed of a pair of layers CL1, CL2 through the process described above is wound by the winding mechanism 360b. It should be noted that by cutting the screen substrate 101 so as to have a predetermined size, a sheet of screen substrate 1 in the state of being provided with the antireflection film CM is cut out therefrom.

In the manner as described above, the antireflection film CM with the antireflection property and a constant film thickness is formed by the first manufacturing apparatus 300. It should be noted that in the first manufacturing apparatus 300, once the vacuum state is made, the screen substrate 101 can be moved without breaking the vacuum state, and therefore it is possible to form the antireflection film CM on a plurality of screen substrates 1 in a lump.

Figure 5B:
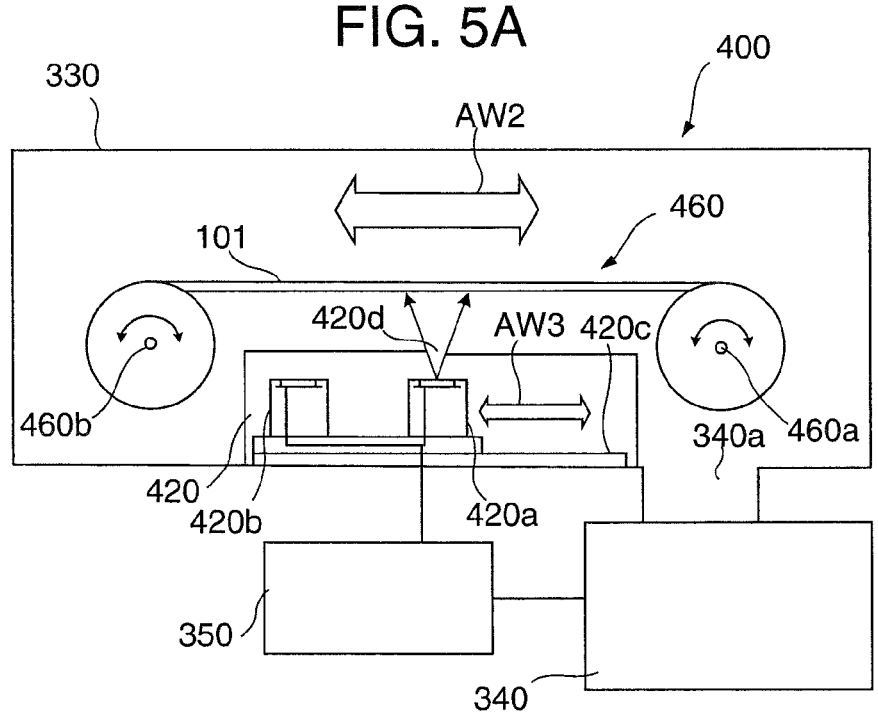

Further, the films can also be formed in substantially the same manner as described above by a first manufacturing apparatus 400 shown in FIG. 5B. The first manufacturing apparatus 400 corresponds to a modified example of the first manufacturing apparatus 300. In the first manufacturing apparatus 400, it becomes possible that mechanisms 460a, 460b constituting a moving device 460 rotate in both directions in sync with each other, thereby moving the screen substrate 101 reciprocally in directions indicated by the arrow AW2 at a constant speed. Further, ejection devices 420a, 420b of an evaporation source device 420 are arranged to be slidable on a pedestal 420c in directions of the arrow AW3.

According to the configuration described above, the first manufacturing apparatus 400 can first form the first layer CL1 by disposing the first ejection device 420a so as to be opposed to an ejection opening 420d when moving the screen substrate 101 toward the right side of the sheet of the drawing. Further, when moving the screen substrate 101 toward the left side of the sheet, the second layer CL2 can be formed by previously sliding the ejection devices 420a, 420b inside the evaporation source device 420 to position the second ejection device 420b so as to be opposed to the ejection opening 420d. It should be noted that in the case of film formation by the first manufacturing apparatus 400 shown in the drawing, it is possible to form the antireflection film CM having a structure with a larger number of layers by repeating the operation described above.

Figure 6:
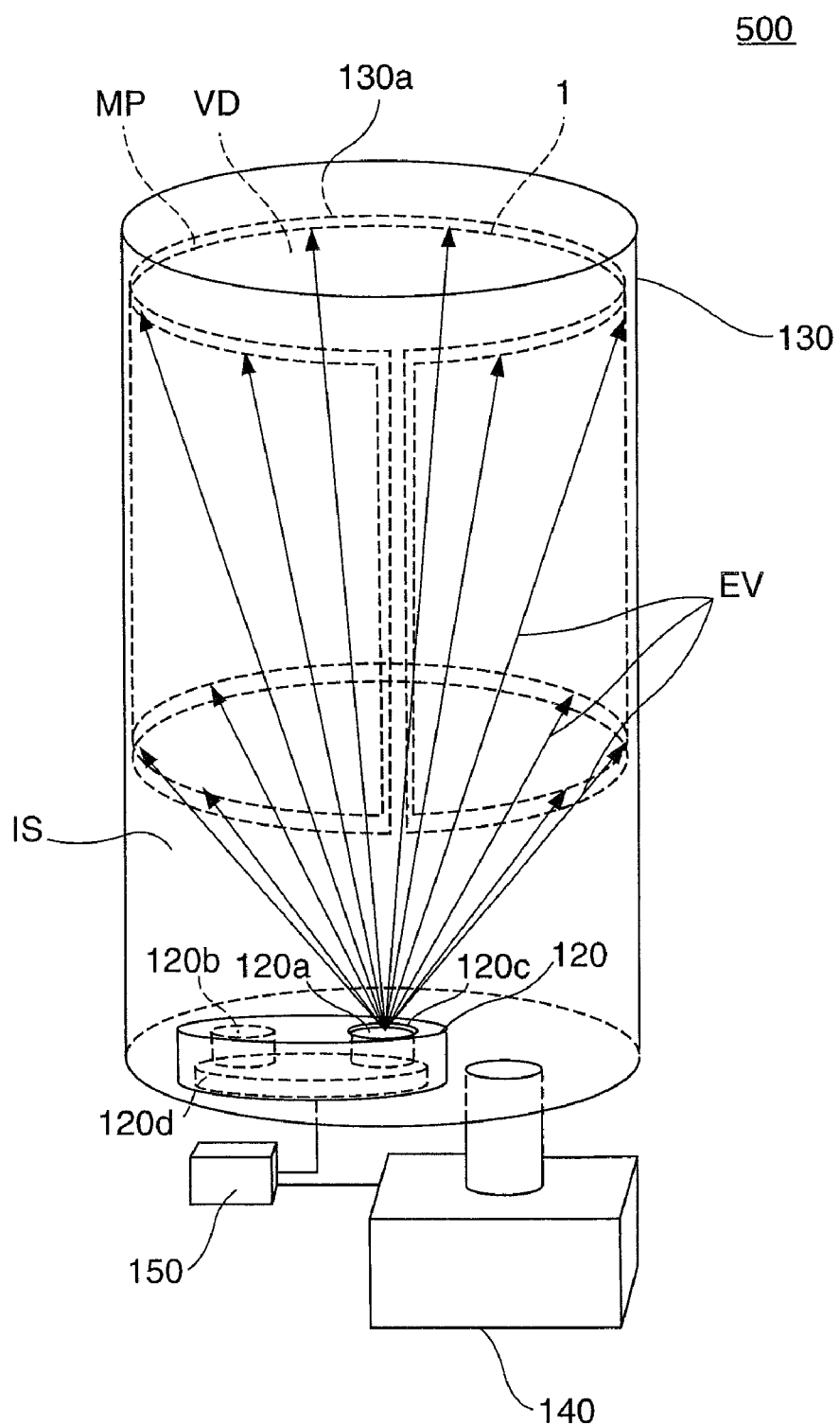
FIG. 6 is a perspective view for explaining an example of a manufacturing apparatus for forming a reflecting film and a covering film.
Figure 7A:
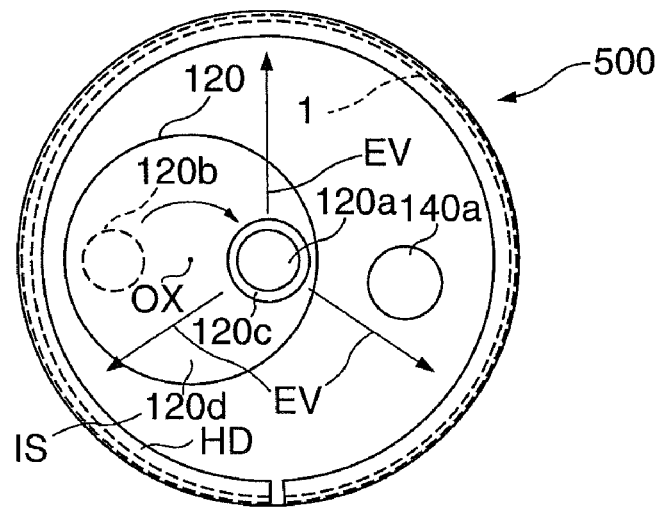
FIGS. 7A and 7B are a plan view and a side cross-sectional view for explaining an example of a manufacturing apparatus for forming the reflecting film and the covering film.
Figure 7B:
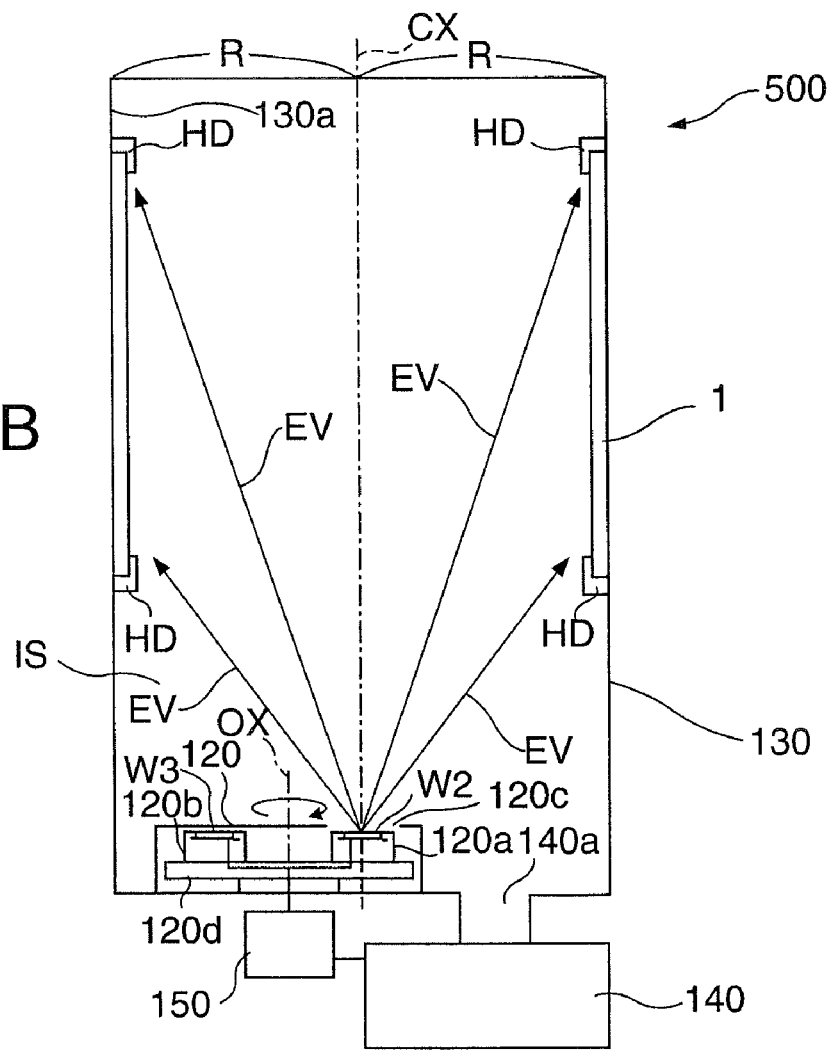

Then, the second and third film forming processes will be explained with reference to FIGS. 6, 7A, and 7B. FIGS. 6, 7A, and 7B are a perspective view, a plan view, and a side cross-sectional view for explaining an example of a second manufacturing apparatus for forming the reflecting film RM and the covering film IM respectively in the second and third film forming processes. The second manufacturing apparatus 500 shown, for example, in FIG. 6 is a vacuum evaporation apparatus for performing film formation by the vacuum evaporation with a film forming material evaporated by, for example, resistive heating similarly to the first manufacturing apparatus 300, and is provided with an evaporation source device 120, a chamber 130, a vacuum pump 140, and a control device 150. The evaporation source device 120 is provided with a first ejection device 120a for ejecting aluminum as a second film forming material W2 for forming the reflecting film, and a second ejection device 120b for ejecting silicon dioxide ($SiO_2$) as a third film forming material W3 for forming the covering film. The evaporation source device 120 has a cylindrical shape, and is provided with a pedestal 120d rotatable around a central axis OX. The evaporation source device 120 has a turret structure capable of rotationally moving the first and second ejection devices 120a, 120b supported by the pedestal 120d to dispose either one of the ejection devices on a central axis CX, and ejecting the respective film forming materials W2, W3 from an ejection opening 120c.

The second manufacturing apparatus 500 has a cylindrical shape with a predetermined radius, and an internal space IS formed by a chamber 130 also has a cylindrical shape. As described above, either one of the first and second ejection devices 120a, 120b is disposed on the central axis CX inside the evaporation source device 120. The first and the second ejection devices 120a, 120b respectively mount the second and the third film forming materials W2, W3 on the boats, and heat to evaporate the respective film forming materials W2, W3 by, for example, the resistive heating using the electrical power supplied from the control device 150, thereby performing the film formation. It should be noted here that aluminum is used as an example of the second film forming material W2, and silicon dioxide ($SiO_2$) is used as the third film forming material W3. The chamber 130 has an internal surface 130a in the internal space IS, the internal surface 130a corresponding to a side surface of the cylindrical shape section with the central axis CX and a radius R. The radius R and the position of the first ejection device 120a or the second ejection device 120b on the central axis CX are determined in accordance with how the screen 10 shown, for example, in FIG. 1 is used.

As shown, for example, in FIG. 6, the screen substrate 1 is mounted along the internal surface 130a (a mounting process). In further specific explanations, the screen substrate 1 is firstly disposed along the internal surface 130a so as to form a cylindrical shape as shown in FIG. 6, and the longitudinal direction (corresponding to a longitudinal direction of the screen 10) of the screen substrate 1 corresponds to the circumferential direction of the cylindrical shape. Further, as shown in FIGS. 7A and 7B, the screen substrate 1 is fixed by a holder HD along the internal surface 130a at a height position corresponding to how the screen 10 is used. It should be noted that the holder HD has contact only with a margin portion MP as a peripheral area outside an effective area VD of the screen substrate 1 shown in FIG. 6. The margin portion MP is cut out after the film forming process if necessary.

Hereinafter, an operation of the second manufacturing apparatus 500 will be explained. Firstly, the air is exhausted from an exhaust port 140a of the vacuum pump 140 to make a vacuum state with pressure no higher than a predetermined value (e.g., no higher than $10^{-3}$ Pa) inside the chamber 130. Then, by turning the evaporation source device 120, the first ejection device 120a is placed on the central axis CX. When the first ejection device 120a is placed on the central axis CX, the second film forming material W2 is heated to evaporate. Here, since the desired vacuum state is provided in the chamber 130, the second film forming material W2 becomes to have an ejection path EV emitted radially from the evaporation source device 120 as illustrated with the arrows shown, for example, in FIG. 6, and the second film forming material W2 is deposited on the screen substrate 1. Thus, the reflecting film RM is formed as shown in FIG. 4B (a reflecting film forming process). Subsequently, after turning the evaporation source device 120 to place the second ejection device 120b on the central axis CX, the third film forming material W3 is heated to be evaporated, thereby forming the covering film IM as shown in FIG. 4C in the same manner. According to the processes described above, the screen 10 is manufactured. It should be noted that on this occasion, since the first ejection device 120a and the second ejection device 120b eject the film forming materials W2, W3 from the same position, the covering film IM can be formed on the same area as the reflecting film RM. Further, in the case of forming a reflection enhancement film with a multilayer film structure as the covering film IM, it is possible to provide three or more ejection devices in the evaporation source device 120 and to repeatedly perform the film formation with these ejection devices, thereby forming the multilayer film structure.

It should be noted that in the second manufacturing apparatus 500, it is arranged that the first ejection device 120a in a plan view is located at the center portion of the cylindrical shape while the screen substrate 1 is located on one circumference of a circle, as shown in FIG. 7A. Further, as illustrated with the arrows in FIG. 7B, the ejection path EV of the second film forming material W2 is arranged to be symmetric with respect to the screen substrate 1. In other words, on the screen substrate 1, the film is formed in the condition in which the ejection angle of the second film forming material W2 in a cross-sectional plane perpendicular to the longitudinal direction (corresponding to the longitudinal direction of the screen 10) is kept constant everywhere. Thus, it is possible to form the reflecting film RM, which is located on the upper part of the surface of each of the three-dimensional shape units 2a as shown, for example, in FIG. 3, so as to have the boundary line along the horizontal direction, namely the x direction. Since the reflecting film RM has such a shape, the outside light OL from above is prevented from entering substantially uniformly everywhere on the screen 10, thereby preventing the reflection of the outside light OL.

In general, the projection light PL from the projector or the like is emitted from a point-like light source and spread conically to enter the screen 10. In contrast thereto, the outside light OL from above mainly due to the illumination or the like is emitted from a linear light source or a surface light source, and enters the entire screen evenly with a certain incident angle distribution. Therefore, in order for further improving the contrast, it is desirable for the shape of the reflecting film RM to correspond to the difference in incident condition to the screen 10 between the projection light PL and the outside light OL described above. In the manufacture of the screen 10 with the second manufacturing apparatus 500, since the reflecting film RM is formed to have the shape described above, it is possible to arrange the reflecting film RM so as to be able to prevent the reflection of the outside light OL substantially evenly. Further, as described above, in the chamber 130, the radius R of the cylindrical shape and the position of each of the ejection devices 120a, 120b on the central axis CX are accurately defined in accordance with how the screen 10 shown, for example, in FIG. 2 is used. More specifically, the value of the radius R is adjusted in accordance with the projection distance d of the projection light PL shown in FIG. 2, and the position of each of the ejection devices 120a, 120b is adjusted in accordance with the projection light source point S of the projection light PL. In other words, the incident angle of each of the film forming materials W2, W3 to the screen substrate 1 is determined taking the incident angle of the projection light PL to the screen 10 into consideration. According to the processes described above, since the reflecting film RM formed on the surface of a number of three-dimensional shape units 2a is arranged to correspond to how the screen 10 is used, the reflecting film RM also has a shape determined in consideration of preventing degradation of the reflection efficiency of the projection light PL from the projection device or the like. Further, by forming the chamber 130 to have a cylindrical shape, it becomes possible to make the vacuum space for accommodating the screen 10 relatively small.

As described above, since the antireflection film CM can firstly be formed as a first film in the first film forming process throughout the entire surfaces of all of a number of three-dimensional shape units 2a keeping the thickness of the film in a uniform state, the screen 10 according to the present embodiment can be provided with a relatively high antireflection property. Although regarding the film formation of the antireflection film CM, as another method than described above, it is also possible to, for example, use the evaporation from an oblique direction, which is used for forming the reflecting film RM, to deposit the antireflection film CM only on the portion where no reflecting film RM is formed, in this case, it does not necessarily become possible with ease to form the film while keeping the thickness of the film constant.

Further, in the present embodiment, since the reflecting film RM is formed taking the incident characteristic of the projection light PL and the incident characteristic of the outside light OL into consideration in the second film forming process, the screen 10 is also arranged to prevent the outside light OL from being reflected in the reflecting film RM in addition to performing the efficient reflection of the projection light. Further, by forming the covering film IM in the third film forming process, it becomes possible to prevent the reflecting film RM from exfoliating or oxidizing, thereby achieving the longer operating life, or enhancement of the reflecting property.

Figure 8:
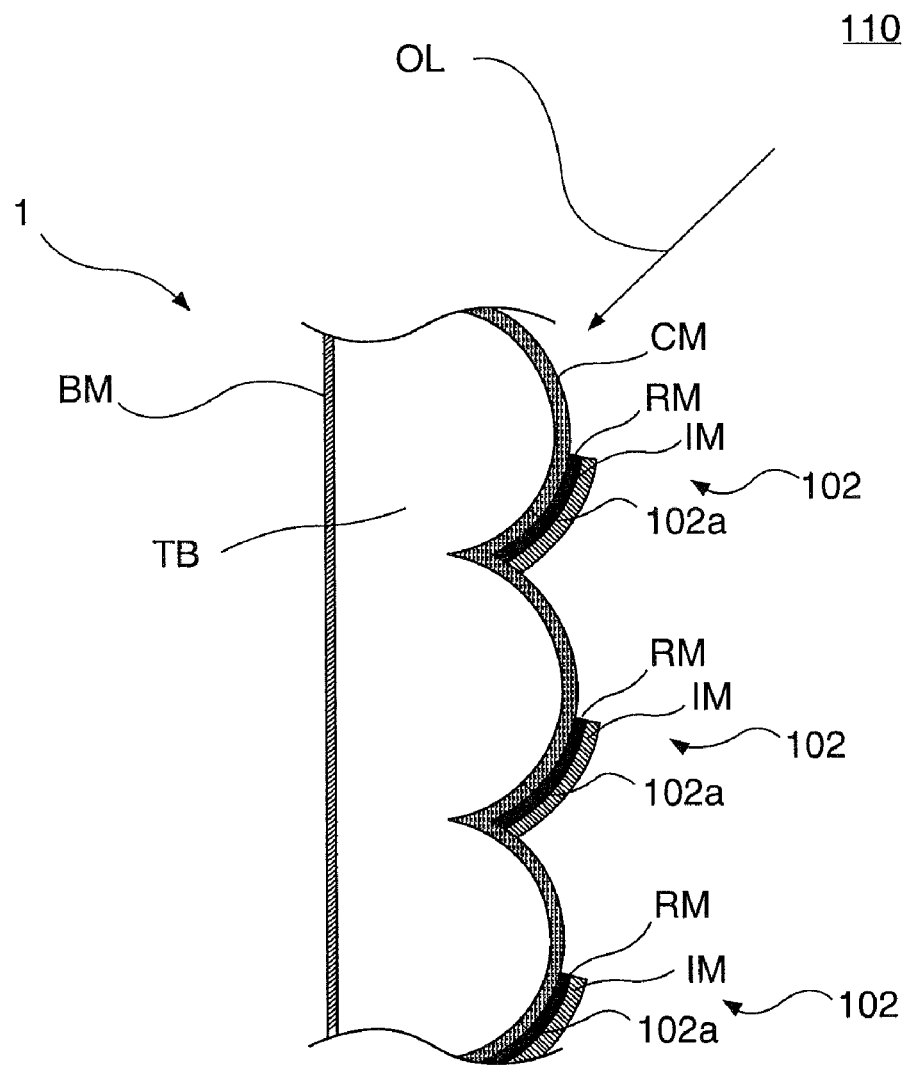
FIG. 8 is a side cross-sectional view for explaining a modified example of the screen.

FIG. 8 shows a modified example of the screen 10 shown, for example, in FIG. 3. In the screen 110 shown in FIG. 8, each surface section 102 is arranged to have a convex shape. It should be noted that in this case, the reflecting film RM and the covering film IM are formed on the lower part, namely the −y direction side on each of the three-dimensional shape units 102a.

Figure 9:
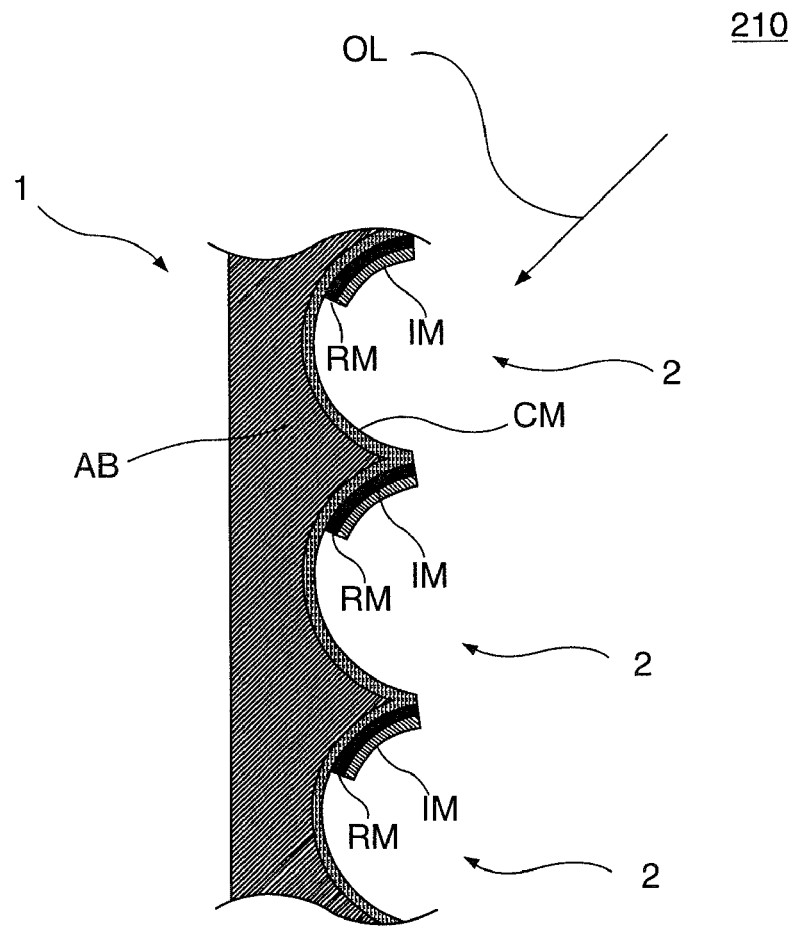
FIG. 9 is a side cross-sectional view for explaining another modified example of the screen.

Further, regarding the screen substrate 1, it is also possible to manufacture the screen 210 using a light absorbing member AB as shown in FIG. 9 instead of the transparent member TB and the light absorbing surface BM. As a material of the light absorbing member AB, black polyethylene terephthalate (PET), black polyvinyl chloride, and so on having a light absorbing function can be considered.

Further, although aluminum is used as the film forming material W2 in the forming process of the reflecting film RM, in the case of forming the reflecting film RM from a metal film, silver or the like can also be used besides aluminum.

Further, although in the case described above it is assumed that the first ejection device 120a (the second ejection device 120b) is placed on the central axis CX to perform the film formation, the placement position is not only on the central axis CX but also in the vicinity of the central axis CX, and further, it is also possible that each of the ejection devices 120a, 120b is formed of a plurality of boats, and each of the ejection devices 120a, 120b is placed on the central axis CX or in the vicinity thereof.

Further, although in the case described above, the internal surface 130a of the chamber 130 is used as the internal surface for mounting the screen substrate 1, it is also possible to separately provide the internal surface for mounting the screen substrate 1 inside the chamber 130.

Second Embodiment

Figure 10A:
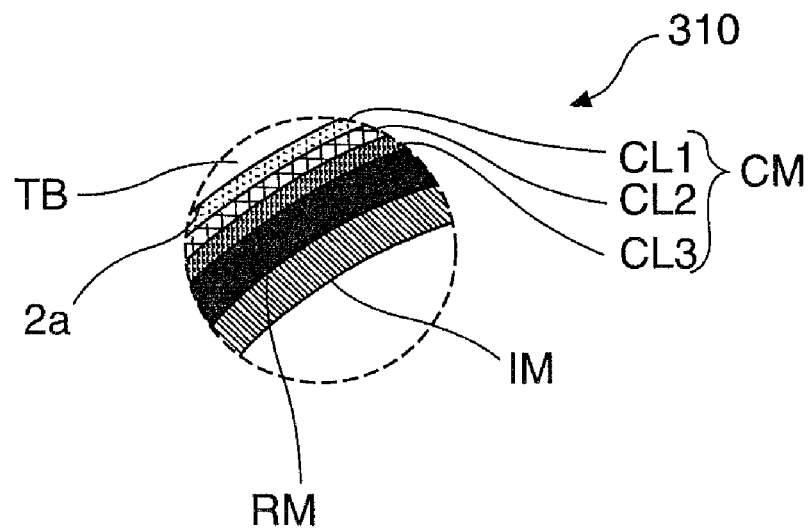
FIGS. 10A and 10B are side cross-sectional diagrams each explaining a screen according to a second embodiment.
Figure 10B:
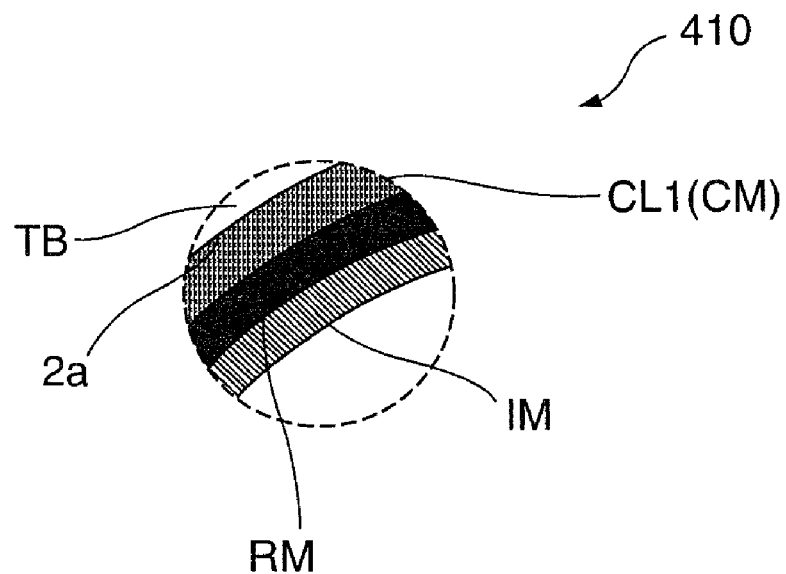

FIGS. 10A and 10B are diagrams each explaining a screen according to a second embodiment. Since the screen according to the present embodiment is the same as that described as the first embodiment except the structure of the antireflection film, detailed explanations regarding the other structures will be omitted.

In the screen 310 shown in FIG. 10A, the antireflection film CM is formed to have a three-layer structure composed of first through third layers CL1, CL2, CL3. In this case, it is possible, for example, to form a metal layer having a light absorbing property as the first layer CL1 as the lowermost layer of the antireflection film CM, and to form dielectric layers as the second and the third layers CL2, CL3 on the first layer CL1 for addressing the outside light component reflected on the metal layer as the first layer CL1. By thus forming the antireflection film CM as a composite film including the metal layer and the dielectric layers, it becomes possible to make the antireflection film have a higher antireflection property.

Further, as another example of the present embodiment, it is also possible to make the antireflection film CM have a single layer structure as a screen 410 shown in FIG. 10B. In this case, by using, for example, magnesium fluoride ($MgF_2$) as the film forming material of the first layer CL1 to be, for example, the antireflection film CM, a necessary antireflection property can be provided to the antireflection film CM.

Figure 11:
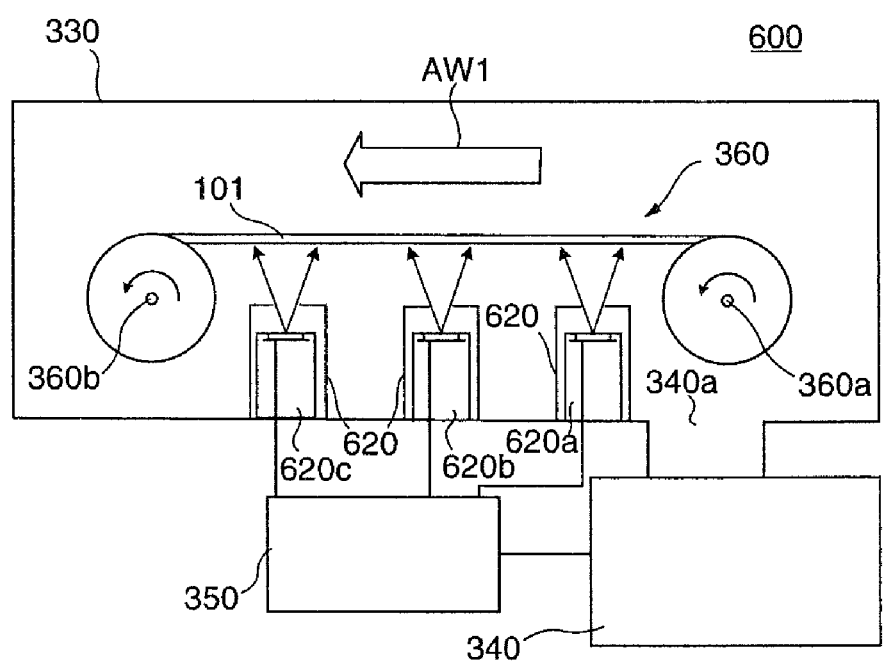
FIG. 11 is a side cross-sectional diagram of a manufacturing apparatus for forming the antireflection film according to the second embodiment.

Hereinafter, a method of manufacturing the screen according to the present embodiment will be explained. FIG. 11 is a diagram for explaining a first manufacturing apparatus for performing the first film forming process among the film forming processes for manufacturing the screen 310 shown in FIG. 10A. The first manufacturing apparatus 600 according to the present embodiment corresponds to a modified example of the first manufacturing apparatus 300 shown in FIG. 5A. It should be noted that since the method of manufacturing a screen according to the present embodiment is the same as that described as the first embodiment except the first film forming process, illustrations and explanations of the film forming processes other than the first film forming process will be omitted.

The first manufacturing apparatus 600 shown in FIG. 11 is a vacuum evaporation apparatus for evaporating the film forming materials, for example, by resistive heating, thereby performing the film formation by the vacuum evaporation, and is provided with an evaporation source device 620, a chamber 330, a vacuum pump 340, a control device 350, and a moving device 360 for feeding the belt like screen substrate 101, similarly to the first manufacturing apparatus 300. The moving device 360 is provided with a delivery mechanism 360a for delivering the screen substrate 101, and a winding mechanism 360b for winding the screen substrate 101, and moves the screen substrate 101 in one direction (the direction of the arrow AW1 in the drawing) at a constant speed using the mechanisms 360a, 360b. Further, among the constituents described above, the evaporation source device 620 is particularly provided with three ejection devices, namely first through third ejection devices 620a, 620b, 620c. By the three ejection devices 620a, 620b, 620c, the layers CL1, CL2, CL3 constituting the antireflection film CM of the screen 310 shown in FIG. 10A are formed respectively. It should be noted that regarding the manufacture of the screen 410 shown in FIG. 10B, it is possible to provide a single ejection device in the evaporation source device 620.

Third Embodiment

Figure 12:
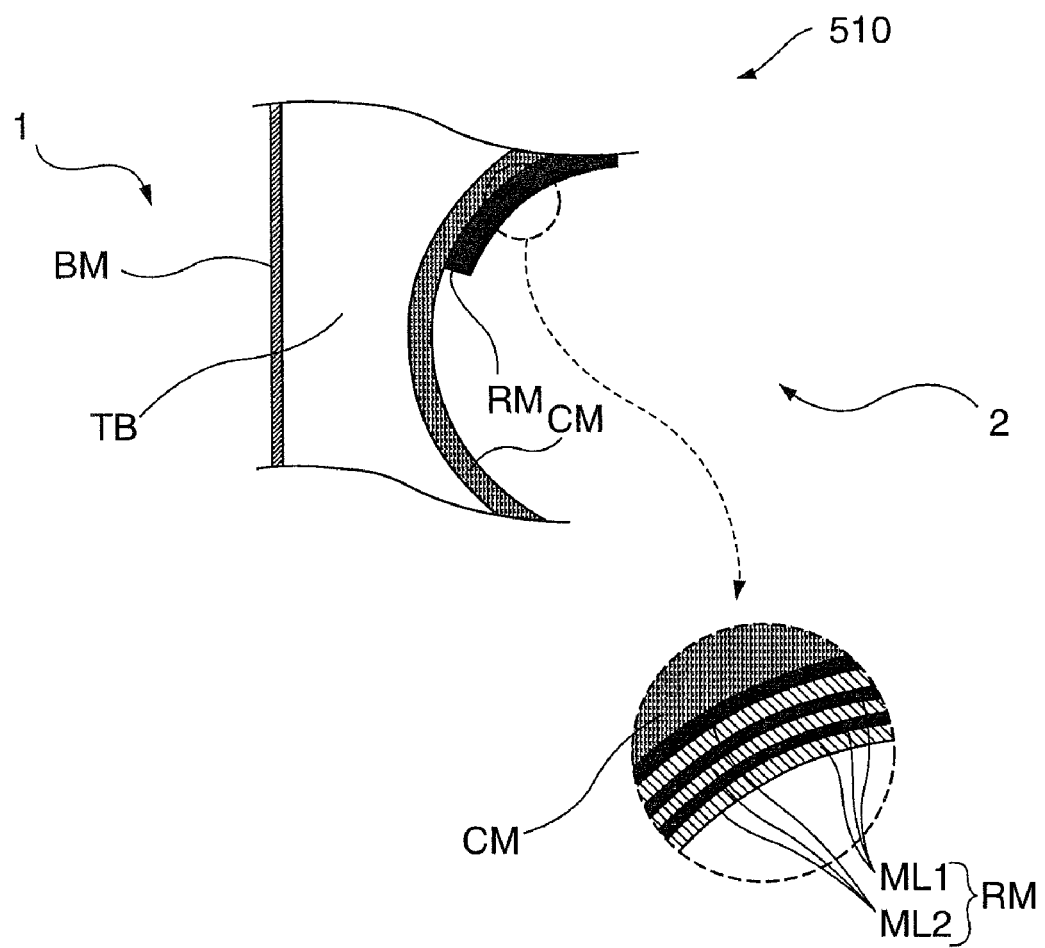
FIG. 12 is a side cross-sectional view for explaining a screen according to a third embodiment.

FIG. 12 is an enlarged side cross-sectional view for showing a part of a screen according to a third embodiment. The screen 510 according to the present embodiment corresponds to a modified example of the screen 10 and so on, and is provided with the screen substrate 1, the antireflection film CM, and the reflecting film RM. In particular, the reflecting film RM has a dielectric multilayer film structure having two types of dielectric layers ML1, ML2 with refractive indexes different from each other stacked alternately. The dielectric layers ML1, ML2 can be composed, for example, of $TiO_2$ and $SiO_2$, or $Ta_2O_5$ and $SiO_2$. In this case, unlike the case with the screen 10 or the like, since it is possible to make the reflecting film RM itself strong enough, it is possible to form the condition in which the most superficial layer of the dielectric multilayer film is exposed as a part of the surface of the screen 510 without providing the covering film on the reflecting film RM. It should be noted that the dielectric multilayer film structure can be manufactured, for example, in the second manufacturing apparatus 500 shown in FIG. 6, by repeatedly ejecting the film forming materials for forming the dielectric layers ML1, ML2 alternately using the first and the second ejection devices 120a, 120b of the evaporation source device 120.

Fourth Embodiment

Figure 13:
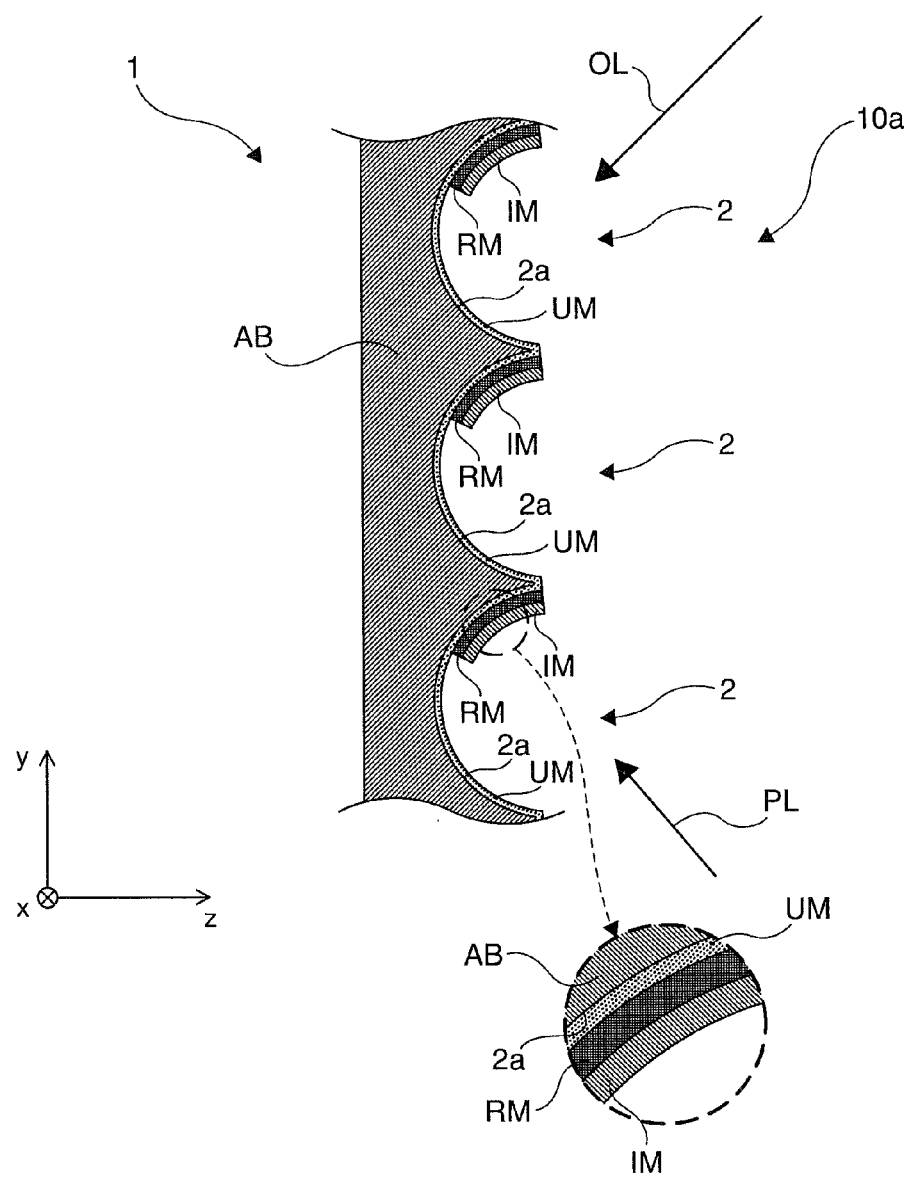
FIG. 13 is a side cross-sectional view for explaining a screen according to a fourth embodiment.

FIG. 13 is a diagram for explaining a screen according to a fourth embodiment. The screen 810 according to the present embodiment has substantially the same structure as the screen 10 of the first embodiment except the point that a light absorbing member AB made, for example, of black polyvinyl chloride is used as the screen substrate 1 and the point that a foundation film UM is provided instead of the antireflection film CM.

The light absorbing member AB forming the screen substrate 1 absorbs the outside light OL by itself, thereby making it possible to eliminate the antireflection film CM shown, for example, in FIG. 3. The light absorbing member AB is what is obtained by adding carbon or the like as a light absorbing material to polyvinyl chloride resin and forming it as a sheet, namely a sheet of black polyvinyl chloride. The foundation film UM is a first film intervening between the reflecting film RM and the light absorbing member AR, and has a role of enhancing adhesion strength of the reflecting film RM to the screen substrate 1, for example. In particular, in the case in which the light absorbing member AB is made of soft polyvinyl chloride or the like, the plasticizing agent or the like volatilizes to enhance exfoliation of the reflecting film RM formed on the screen substrate 1 by vacuum evaporation or the like. Therefore, by previously forming the foundation film UM capable of suppressing or blocking the volatilization of the plasticizing agent on the surface of the light absorbing member AB forming the screen substrate 1, it becomes possible to enhance the adhesiveness of the reflecting film RM to the screen substrate 1 and to stabilize the state of the reflecting film RM. The foundation film UM can be made as a metal film made, for example, of Cr or NiCr, and can also be made as a film of an organic material such as acrylic resin or fluorinated resin, or a nonmetallic film.

Figure 14A:
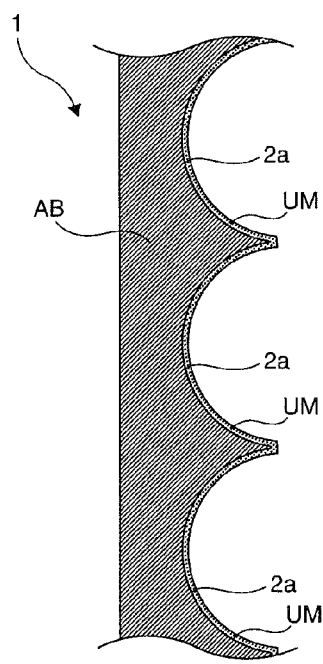
FIGS. 14A through 14C are side cross-sectional views for explaining a manufacturing process of a surface section of the screen.
Figure 14B:
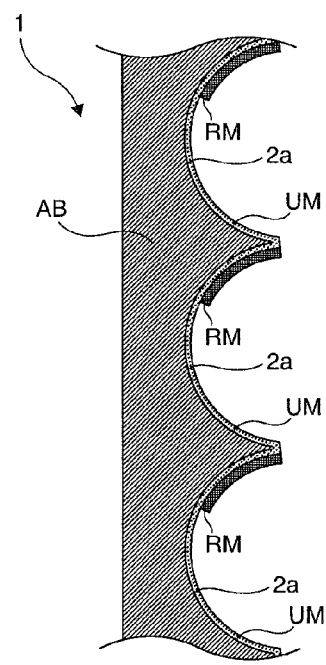
Figure 14C:
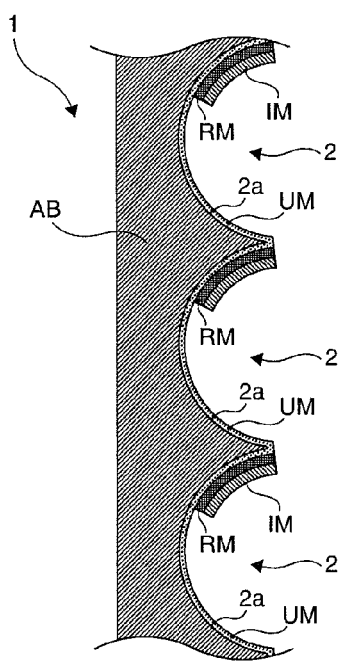

Hereinafter, a method of manufacturing the screen 810 according to the present embodiment will be explained. FIGS. 14A through 14C are side cross-sectional views for explaining the process of manufacturing mainly a number of surface sections 2 among the sections of the screen 810 shown in FIG. 13. Each of the surface sections 2 is configured including the foundation film UM, the reflecting film RM, and the covering film IM. Firstly, as shown in FIG. 14A, the foundation film UM is formed on the entire surface of a number of three-dimensional shape units 2a with a roughly constant film thickness (e.g., 10 nm or smaller) (a first film forming process). The foundation film UM is uniformly formed so as to cover the entire surface of the screen substrate 1 by making the first film forming material enter uniformly on the screen substrate 1. Then, as shown in FIG. 14B, the reflecting film RM is formed (a second film forming process) in a partial area on the surface of each of the three-dimensional shape units 2a, and subsequently, as shown in FIG. 14C, the covering film IM is formed (a third film forming process) on the reflecting film RM. According to the process described above, a number of surface sections 2 are formed on the screen substrate 1, thus the screen 810 is completed. It should be noted that although omitted in the drawings, in a brief explanation of the process prior to the formation of the three-dimensional shape units 2a, a sheet made, for example, of black polyvinyl chloride is firstly prepared as the light absorbing member AB. Subsequently, a number of three-dimensional shape units 2a is transferred on the surface of the black polyvinyl chloride sheet using a thermal press process, thereby obtaining the screen substrate 1 provided with a number of three-dimensional shape units 2a.

In an explanation of the first film forming process, the foundation film UM is formed on the entire surface of the screen substrate 1, namely the surfaces of a number of three-dimensional shape units 2a with a substantially constant thickness. In the case in which the foundation film UM is formed of a film of metal such as Cr or NiCr, the foundation film UM is formed using, for example, a vacuum evaporation film formation apparatus having substantially the same mechanism as that of the first manufacturing apparatus 300 shown in FIG. 5A. It should be noted that the evaporation source device 320 of this case is arranged to have only a single ejection device for ejecting the first film forming material (specifically Cr, NiCr, etc.) for forming the foundation film UM. The thickness of the foundation film UM formed in the manner as described above is arranged to be in a range of 5 through 10 nm, for example. On the other hand, in the case in which the foundation film UM is formed of a film made of an organic material such as acrylic resin or fluorinated resin, or a nonmetallic film, the foundation film UM is formed by a wet coating method using a dipping process. It should be noted that a solution for a dipping process is obtained by mixing a main component of the film such as acrylic and various kinds of additive agents to an organic solvent, and by dipping the screen substrate 1 in the solution for a predetermined period of time, and then pulling out the screen substrate 1 therefrom and drying it, the foundation film having a desired film thickness and relatively firmly attached to the screen substrate 1, namely the light absorbing member AB can be formed thereon. The thickness of the foundation film UM formed in the manner as described above is arranged to be in a range of 1 through 10 μm, for example.

In the first film forming process described above, in the case of forming the foundation film UM from the metal such as Cr or NiCr, it is also possible to use a physical deposition method such as an ion assisted method or a sputtering method, or a physical vapor deposition method besides the vacuum evaporation method. In the case of forming the foundation film UM from an organic material such as acrylic resin or fluorinated resin, or a nonmetallic material, other coating methods such as a spray method than the coating method such as the dipping process can also be used.

It should be noted that the second film forming process shown in FIG. 14B corresponds to the second film forming process shown in FIG. 4B, and the third film forming process shown in FIG. 14C corresponds to the third film forming process shown in FIG. 4C. In other words, using the vacuum evaporation process or the like, the reflecting film RM and the covering film IM are formed sequentially on the partial area on the three-dimensional shape units 2a.

It is also possible to execute a surface activation treatment of the foundation film UM prior to the formation of the reflecting film RM on the foundation film UM. As the surface activation treatment of the foundation film UM, there can be adopted a reverse sputtering treatment, a plasma discharge treatment, corona discharge treatment, an RF bombard treatment, an atmospheric-pressure plasma treatment, and so on. By appropriately executing the surface activation treatment on the foundation film UM, it is possible to improve adhesion and durability of the reflecting film RM.

Although in the explanations described above, the covering film IM is formed on the reflecting film RM, if the reflecting film RM has sufficient strength with respect to a weathering performance, the covering film IM can be eliminated.

Further, the shape of each of the three-dimensional shape units 2a formed on the screen substrate 1 is not limited to the concave surface, but can be a convex surface as shown in FIG. 8. In this case, the reflecting film RM and the covering film IM are formed on the lower side, namely on the side in the −y direction.

As described above, according to the screen 810 related to the present embodiment, since the foundation film UM for reinforcing the adhesion of the reflecting film RM is formed as the first film in the first film forming process for manufacturing the screen 810, the adhesion strength of the reflecting film to the screen substrate 1 can be improved, the reflecting film RM can be formed at intended places, and the durability thereof can be improved. Thus, the screen 810 capable of performing stable projection with preferable image quality can be provided.

Fifth Embodiment

Figure 15:
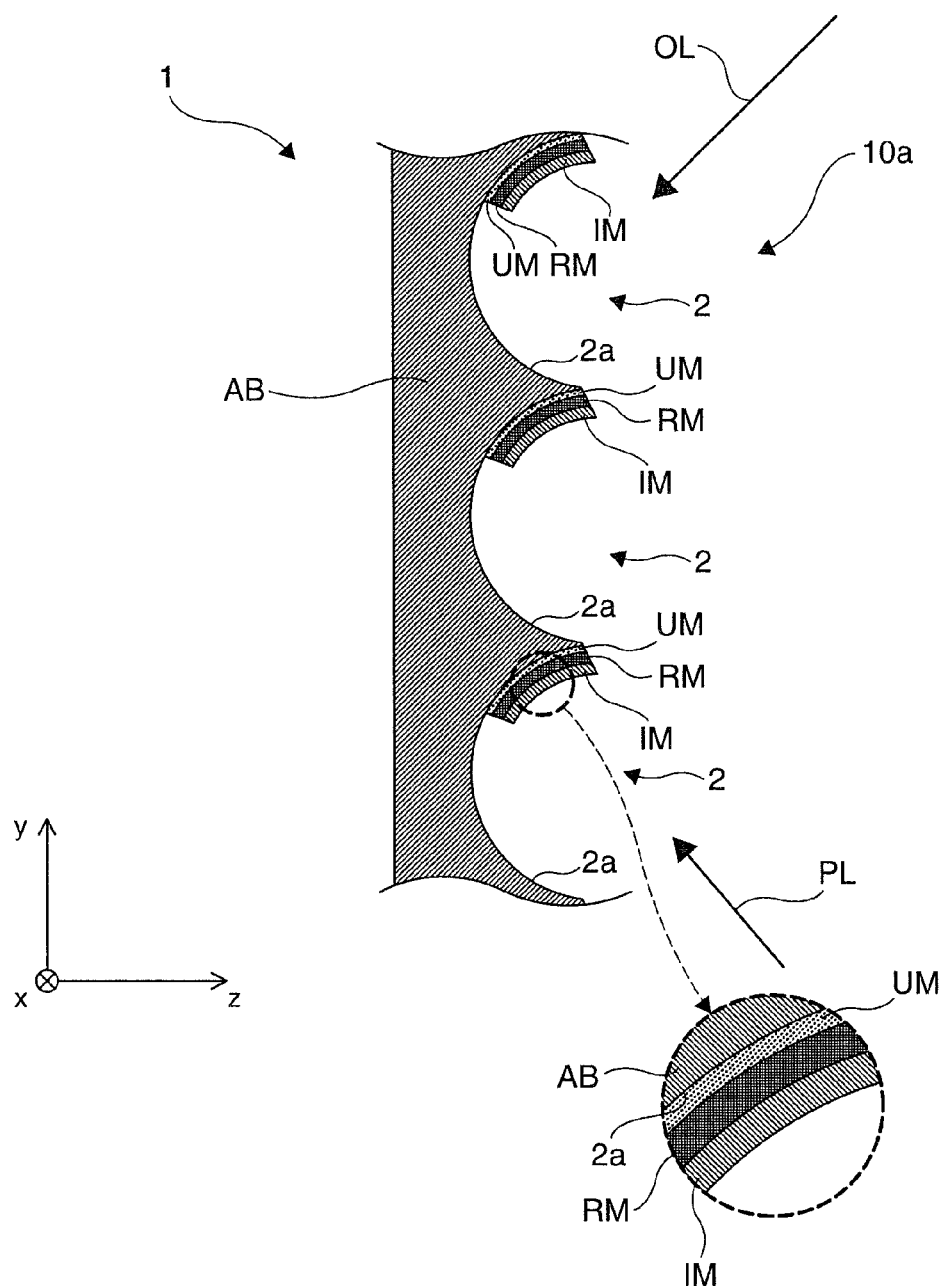
FIG. 15 is a side cross-sectional view for explaining a screen according to a fifth embodiment.

FIG. 15 is a diagram for explaining a screen according to a fifth embodiment. Further, FIGS. 16A through 16D are side cross-sectional views for explaining the process of manufacturing mainly a number of surface sections 2 among the sections of the screen 910 shown in FIG. 15. It should be noted that the screen 910 according to the present embodiment has substantially the same structure as the screen 810 of the fourth embodiment except the area where the foundation film UM is formed.

In the case of the screen 910 shown in the drawings, the foundation film UM as the first film is not formed on the entire surface of the screen substrate 1, but is formed in a partial area (on the upper side, namely on the side in the +y direction in the example shown in the drawings) on the surface of each of a number of three-dimensional shape units 2a. The foundation film UM is nonuniformly formed so as to partially cover the surface of the screen substrate 1 by making the first film forming material enter at an appropriate incident angle on the screen substrate 1. By thus providing areas provided with the foundation film UM and areas not provided with the foundation film UM, the adhesion strength of the reflecting film to the screen substrate 1 becomes different between locals. In other words, the reflecting film RM formed on the foundation film UM adheres relatively firmly to the screen substrate 1 to form the state of being hardly exfoliated, while the reflecting film (a part of the reflecting layer RL shown in, for example, FIG. 16B) formed on the light absorbing member AB adheres relatively weakly to the screen substrate 1 to form the state of being easily exfoliated. By using this arrangement, even in the case of forming the reflecting layer RL on the entire surface of the screen substrate 1, the reflecting layer RL formed on the light absorbing member AB exposed with no foundation film UM is locally removed by cleansing or the like, and the remaining reflecting film RM becomes the reflecting film formed so as to be opposed to the projection light PL from below. In other words, the reflecting film RM formed on the foundation film UM and remaining thereon is arranged to reflect the projection light PL to the front side, where the observer is located, in an appropriately diffused state. It should be noted that the reflecting film RM formed on the foundation film UM and remaining thereon is arranged not to reflect the outside light OL, which enters from above, to the front side where the observer is located.

Hereinafter, a method of manufacturing the screen 910 according to the present embodiment will be explained.

Figure 16A:
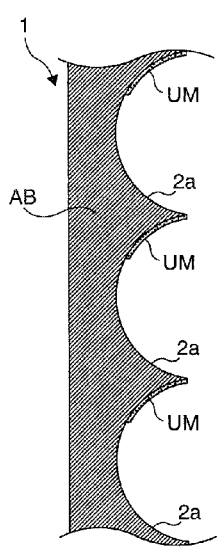
FIGS. 16A through 16D are side cross-sectional views for explaining a manufacturing process of a surface section of the screen.

In the first film forming process shown in FIG. 16A, the foundation film UM is formed in a partial area on each of the three-dimensional shape units 2a constituting the screen substrate 1 with a substantially constant (e.g., 10 nm or smaller) thickness. In the case in which the foundation film UM is formed of a film of metal such as Cr or NiCr, the foundation film UM is formed using, for example, a vacuum evaporation film formation apparatus having substantially the same mechanism as that of the second manufacturing apparatus 500 shown, for example, in FIG. 6. It should be noted that the evaporation source device 120 of this case is arranged to have only a single ejection device for ejecting the first film forming material (specifically Cr, NiCr, etc.) for forming the foundation film UM. On the other hand, in the case in which the foundation film is formed of a film made of an organic material such as acrylic resin or fluorinated resin, or a nonmetallic film, the foundation film UM is formed, for example, by a coating method using a spray process. It should be noted that the solution to be sprayed is obtained by mixing the main component of the film such as acrylic and various kinds of additive agents to an organic solvent, and by moving a nozzle of a spray with respect to the surface of the screen substrate 1, namely the light absorbing member AB at a slant thereto in a scanning manner, the foundation film UM with a desired thickness relatively firmly attached to the partial area on the three-dimensional shape unit 2a can be formed.

In the first film forming process described above, in the case of forming the foundation film UM from the metal such as Cr or NiCr, it is also possible to use a physical deposition method such as an ion assisted method or a sputtering method, or a physical vapor deposition method besides the vacuum evaporation method.

Figure 16B:
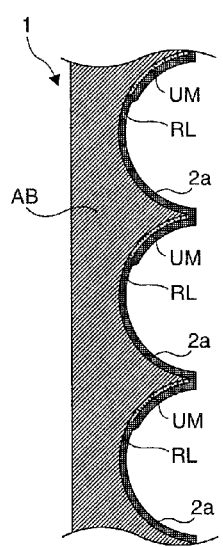

The second film forming process shown in FIG. 16B is similar to the second film forming process shown in FIG. 4B, but is different therefrom in film forming method of the reflecting layer RL corresponding to the reflecting film RM. Unlike the reflecting film RM shown, for example, in FIG. 3, the reflecting layer RL is formed so as to uniformly cover the entire surface of the screen substrate 1, namely the surfaces of a number of three-dimensional shape units 2a. The reflecting layer RL is formed using, for example, an evaporation film formation apparatus having substantially the same mechanism as that of the first manufacturing apparatus 300 shown in FIG. 5A. It should be noted that the evaporation source device 320 of this case is arranged to have only a single ejection device for ejecting the second film forming material (specifically Al, Ag, etc.) for forming the reflecting layer RL.

Figure 16C:
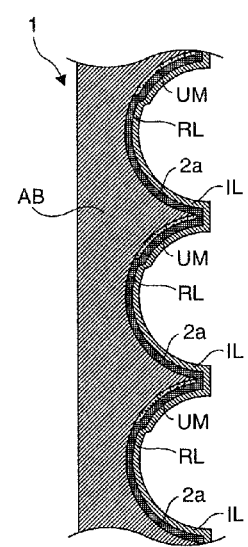

The third film forming process shown in FIG. 16C is similar to the third film forming process shown in FIG. 4C, but is different therefrom in film forming method of the covering layer IL corresponding to the covering film IM. Unlike the covering film IM shown, for example, in FIG. 3, the covering layer IL is formed so as to uniformly cover the entire surface of the screen substrate 1, namely the reflecting layer RL on the surfaces of a number of three-dimensional shape units 2a. The covering layer IL is formed using, for example, an evaporation film formation apparatus having substantially the same mechanism as that of the first manufacturing apparatus 300 shown in FIG. 5A. In this case, the evaporation source device 320 is arranged to have only a single ejection device for ejecting the third film forming material (specifically $SiO_2$, etc.) for forming the covering layer IL.

It should be noted that the process shown in FIGS. 16B and 16C can also be executed in a lump by the same first manufacturing apparatus 300. In this case, it should be arranged that the deposition of the second film forming material is executed by the first ejection device 320a of the evaporation source device 320, and the deposition of the third film forming material is executed by the second ejection device 320b.

Figure 16D:
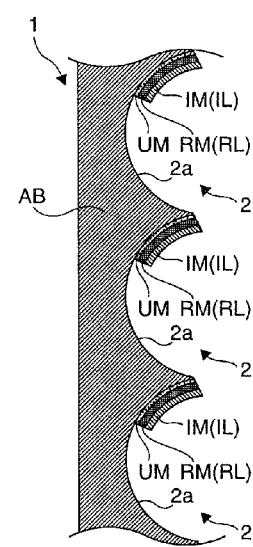

In a partial removal process shown in FIG. 16D, the reflecting layer RL and the covering layer IL are partially removed using a method such as ultrasonic cleansing. As already explained, the reflecting layer RL formed on the light absorbing member AB is relatively weakly attached to the screen substrate 1 to form a state of being easily exfoliated. Therefore, the reflecting layer RL and the covering layer IL formed on the light absorbing member AB exposed from the foundation film UM are locally removed by the cleansing, while the reflecting layer RL and the covering layer IL formed on the foundation film UM, which are relatively firmly attached to the screen substrate 1, remain on the partial area of each of the three-dimensional shape units 2a. The reflecting layer RL and the covering layer IL thus remaining function as the reflecting film RM and the covering film IM, respectively.

In the partial removal process of the reflecting layer RL and the covering layer IL, various measures can be used besides the ultrasonic cleansing. For example, it is possible to remove the unnecessary portions of the reflecting layer RL and the covering layer IL by a mechanical configuration such as sandblasting or brushing, or to use chemicals for exfoliation together in the ultrasonic cleansing.

According to the screen 910 of the present embodiment, the adhesion strength of the reflecting film RM to the screen substrate 1 can be improved by the foundation film UM, and the reflecting film RM can be formed at intended places, thus the durability thereof can be enhanced. Thus, the screen 910 capable of performing stable projection with preferable image quality can be provided.

Although each of the embodiments is hereinabove explained, the embodiments do not limit the invention to the embodiments.

Figure 17A:
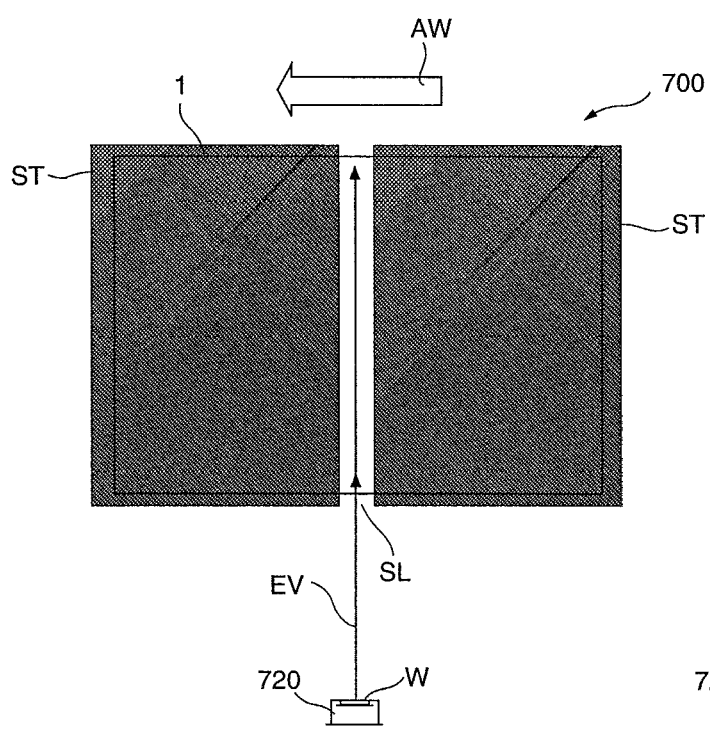
FIGS. 17A and 17B are a front view and a side cross-sectional view for explaining another example of a manufacturing apparatus for forming the reflecting film and the covering film.
Figure 17B:
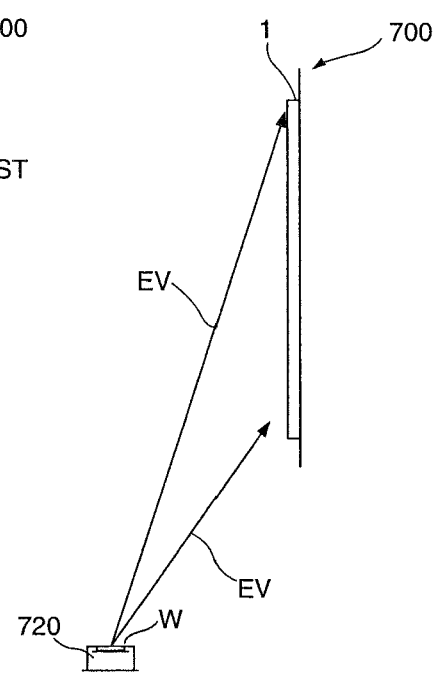

Firstly, although in each of the embodiment described above, it is assumed that the second manufacturing apparatus 500 shown, for example, in FIGS. 17(A) and 17(B) is used for the second and the third film forming processes to perform the film forming processes with the screen substrate 1 fixed along the cylindrical chamber 130, it is also possible to perform the process of the second and the third film forming processes using another manufacturing apparatus. For example, it is also possible to perform the second and the third film forming processes using the second manufacturing apparatus 700 shown in FIGS. 13A and 13B. In more specific explanations, the second manufacturing apparatus 700 is provided with an evaporation source device 720 for ejecting the film forming material W from a predetermined angle to the screen substrate 1 arranged on a plane, and a pair of masks ST for blocking the film forming material W input obliquely from the evaporation source device 720. In the second manufacturing apparatus 700, the film forming material W to be formed as the reflecting film or the covering film is ejected from the evaporation source device 720 while moving the screen substrate 1 in parallel in the direction of the arrow AW shown in the drawing, thereby performing the film formation. In this case, the film forming material W is deposited on the screen substrate 1 only when passing through the slit SL between the pair of masks ST, and the film forming material W to be applied to the screen substrate 1 in a condition with an angle other than the above is blocked by the pair of masks ST to be prevented from being deposited on the screen substrate 1. As a result, the second manufacturing apparatus 700 is arranged to be able to form the reflecting film and the covering film in substantially the same condition as those manufactured by the second manufacturing apparatus 500 shown, for example, in FIG. 6.

Further, although in each of the embodiments described above the vacuum evaporation method is used as an example of the method of forming the antireflection film CM and the reflecting film RM, it is also possible to perform the film formation using other methods such as an ion assisted method or a sputtering method.

Further, the film forming method described in each of the above embodiments can be applied to various screens having a relief shape on the front face of the screen and a reflecting film in some area of the relief shape, and film formation of the antireflection film CM and the reflecting film RM and so on similar to those described above can be performed with respect to those having a prism like surface on the front face of the screen, or those with a relief shape on a cylindrical surface.

Further, the arrangement pattern of a number of three-dimensional shape units 2a arranged two-dimensionally is not particularly limited, and a lattice-like arrangement with respect to the x-y directions, namely vertical and horizontal direction of the screen 10, for example, can be adopted. Further, it is also possible to arrange the three-dimensional shape units 2a so as to be aligned on concentric circles centered on the intersection H shown in FIG. 2, for example.

The entire disclosure of Japanese Patent Application No. 2008-207686, filed Aug. 12, 2008 and Japanese Patent Application No. 2009-164528, filed Jul. 13, 2009 are expressly incorporated by reference herein.

What is claimed is:

1. A screen comprising:
    a screen substrate provided with a plurality of three-dimensional shape units disposed two-dimensionally on a front side of the screen substrate;
    a first film formed on at least part of surfaces of the three-dimensional shape units among the screen substrate; and
    a reflecting film formed on an area corresponding to incidence of projection light among an area of the first film,
    wherein the reflecting film is a metal film,
    the screen further comprises a covering film adapted to cover the metal film, and
    the covering film is one of a metal protecting film formed from a material protecting the metal film and a reflection enhancement film formed from a material enhancing a reflecting operation by the metal film.

2. A method of manufacturing a screen of claim 1, comprising the steps of:
    forming the first film by applying a first film forming material to at least part of surfaces of the three-dimensional shape units among the screen substrate;
    forming the reflecting film by applying a second film forming material with a predetermined incident angle to the screen substrate thereby forming the reflecting film on at least part of the first film; and
    forming the covering film by applying a third film forming material adapted to cover the reflecting film.

3. The method of manufacturing a screen according to claim 2, wherein
    in the second film forming step, the second film forming material is ejected from a material source disposed at a position corresponding to a position of a projection light source point.

4. The method of manufacturing a screen according to claim 2, wherein
    the second film forming step includes
        mounting the screen substrate in a chamber, which includes an internal surface having a cylindrical shape in an internal space, along the internal surface, and
        forming the reflecting film by ejecting the second film forming material from a material source disposed substantially on a central axis of the cylindrical shape in the chamber.

5. The method of manufacturing a screen according to claim 2, wherein
    in the third film forming step, the formation of the third film is executed on a same area as the formation of the second film in the second film forming step.

6. The method of manufacturing a screen according to claim 2, wherein
    in the first and second film forming steps, a method of forming the first and second films with the first and second film forming materials is one of a vacuum evaporation method, an ion assisted method, and a sputtering method.

7. The screen according to claim 1, wherein
the covering film is formed in an area identical to an area of the metal film.

8. The screen according to claim 1, wherein
the reflecting film is a dielectric multilayer film, and
a most superficial layer of the dielectric multilayer film is exposed as a part of a surface of the screen.

9. A screen comprising:
    a screen substrate provided with a plurality of three-dimensional shape units disposed two-dimensionally on a front side of the screen substrate;
    a first film formed on at least part of surfaces of the three-dimensional shape units among the screen substrate; and
    a reflecting film formed on an area corresponding to incidence of projection light among an area of the first film, wherein the first film includes an antireflection film formed on entire areas of surfaces of the three-dimensional shape units.

10. The method of manufacturing a screen of claim 9, comprising the steps of:

forming the first film by applying a first film forming material to at least part of surfaces of the three-dimensional shape units among the screen substrate; and forming the reflecting film by applying a second film forming material with a predetermined incident angle to the screen substrate thereby forming the reflecting film on at least part of the first film, the first film forming step includes forming an antireflection film as the first film on entire areas of surfaces of the three-dimensional shape units.

11. The method of manufacturing a screen according to claim 10, wherein the antireflection film is a dielectric film.

12. The screen according to claim 1, wherein the screen substrate has a light absorbing function.

13. The screen according to claim 12, wherein the screen substrate includes black vinyl chloride as the light absorbing member.

14. A screen comprising:

a screen substrate provided with a plurality of three-dimensional shape units disposed two-dimensionally on a front side of the screen substrate;

a first film formed on at least part of surfaces of the three-dimensional shape units among the screen substrate; and a reflecting film formed on an area corresponding to incidence of projection light among an area of the first film, wherein the first film includes a foundation film to increase attachment strength of the reflection film.

15. The method of manufacturing a screen of claim 14, comprising the steps of:

forming the first film by applying a first film forming material to at least part of surfaces of the three-dimensional shape units among the screen substrate; and forming the reflecting film by applying a second film forming material with a predetermined incident angle to the screen substrate thereby forming the reflecting film on at least part of the first film;

the first film forming step includes forming a foundation film as the first film to increase attachment strength of the reflection film.

16. The screen according to claim 14, wherein the foundation film is a metal film formed by a physical deposition method.

17. The screen according to claim 14, wherein the foundation film is a resin film formed by an applying method.

* * * * *